United States Patent
Tomono et al.

(10) Patent No.: US 7,816,672 B2
(45) Date of Patent: Oct. 19, 2010

(54) WIRING PATTERN, ELECTRONIC DEVICE, ORGANIC SEMICONDUCTOR DEVICE, LAYERED WIRING PATTERN, AND LAYERED WIRING SUBSTRATE USING THE WIRING PATTERN

(75) Inventors: Hidenori Tomono, Kanagawa (JP); Ikue Kawashima, Kanagawa (JP); Koei Suzuki, Kanagawa (JP); Yoshikazu Akiyama, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 356 days.

(21) Appl. No.: 11/846,092

(22) Filed: Aug. 28, 2007

(65) Prior Publication Data

US 2008/0061288 A1   Mar. 13, 2008

(30) Foreign Application Priority Data

Sep. 8, 2006   (JP) .............................. 2006-243988

(51) Int. Cl.
*H01L 35/24* (2006.01)
*H01L 51/00* (2006.01)

(52) U.S. Cl. .......... 257/40; 257/E51.001; 257/E51.002; 438/99

(58) Field of Classification Search ............ 257/40, 257/E51.001, E51.002; 438/99
See application file for complete search history.

(56) References Cited

U.S. PATENT DOCUMENTS

| | | | |
|---|---|---|---|
| 6,707,514 B2 | 3/2004 | Kondoh et al. | |
| 7,166,689 B2 | 1/2007 | Sagisaka et al. | |
| 7,370,412 B2 * | 5/2008 | Hiraoka et al. | ................. 29/852 |
| 7,459,338 B2 * | 12/2008 | Nakayama et al. | ............ 438/99 |
| 7,566,633 B2 * | 7/2009 | Koyama et al. | ............. 438/458 |
| 7,612,455 B2 * | 11/2009 | Tano et al. | ................... 257/779 |
| 2002/0151161 A1 | 10/2002 | Furusawa | |
| 2004/0238816 A1 | 12/2004 | Tano et al. | |
| 2005/0051780 A1 | 3/2005 | Ando et al. | |
| 2006/0115762 A1 | 6/2006 | Katano et al. | |
| 2006/0124925 A1 | 6/2006 | Kondo et al. | |
| 2006/0170067 A1 * | 8/2006 | Maekawa et al. | ........... 257/401 |
| 2006/0170836 A1 | 8/2006 | Kondo et al. | |
| 2007/0054212 A1 | 3/2007 | Akiyama et al. | |
| 2007/0195576 A1 * | 8/2007 | Imada et al. | ................. 365/103 |

FOREIGN PATENT DOCUMENTS

| | | |
|---|---|---|
| JP | 3-178478 | 8/1991 |
| JP | 11-193345 | 7/1999 |
| JP | 11-193346 | 7/1999 |
| JP | 11-193347 | 7/1999 |
| JP | 2002-162630 | 6/2002 |

(Continued)

*Primary Examiner*—Eugene Lee
*Assistant Examiner*—Anthony Ho
(74) *Attorney, Agent, or Firm*—Oblon, Spivak, McClelland, Maier & Neustadt, L.L.P.

(57) ABSTRACT

A wiring pattern is disclosed including: a variable wettability layer including a material whose critical surface tension changes in response to energy provided thereto, the wettability changing layer including a high surface energy part exhibiting a high critical surface tension and a low surface energy part exhibiting low critical surface tension; and a conductive pattern layer formed on the variable wettability layer at the high surface energy part. The conductive pattern layer has an elongated shape with a chamfered corner part in a plan view.

18 Claims, 17 Drawing Sheets

FOREIGN PATENT DOCUMENTS

| | | |
|---|---|---|
| JP | 2003-96034 | 4/2003 |
| JP | 2003-142802 | 5/2003 |
| JP | 2003-267982 | 9/2003 |
| JP | 2004-290958 | 10/2004 |
| JP | 2004-335849 | 11/2004 |
| JP | 2005-285843 | 10/2005 |
| JP | 2005-310962 | 11/2005 |
| WO | WO/2005/077549 A1 | 8/2005 |

* cited by examiner

VARIABLE WETTABILITY MATERIAL

INK

EVAPORATION OF SOLVENT

FLOW OF INK

CHAMFER

CHAMFER LENGTH

FLOW OF INK

L2
L1

AFTER DRYING

PART HAVING LARGE FILM THICKNESS

C　　　　　　　　　　C

BULGE

VARIABLE WETTABILITY LAYER

CONDUCTIVE PATTERN LAYER
(CONDUCTIVE LAYER)

FILM THICKNESS DIRECTION

FILM THICKNESS DIRECTION

WIRING PATTERN, ELECTRONIC DEVICE, ORGANIC SEMICONDUCTOR DEVICE, LAYERED WIRING PATTERN, AND LAYERED WIRING SUBSTRATE USING THE WIRING PATTERN

BACKGROUND OF THE INVENTION

1. Field of the Invention

The present invention relates to a wiring pattern, an electronic device, an organic semiconductor device, a layered wiring pattern, and a layered wiring substrate using the wiring pattern, and more particularly to a shape of a conductive pattern of a wiring pattern and a configuration including the wiring pattern such as an electronic device, an organic semiconductor element, a layered wiring pattern, and a layered wiring substrate.

2. Description of the Related Art

Conventionally, although photolithography methods are used for forming wirings of semiconductor devices and electronic circuits, the use of such photolithography methods requires expensive facilities. Furthermore, the long and complicated procedures of the photolithography methods lead to an increase of manufacturing cost. Recently, a method of forming a wiring pattern by coating liquid containing conductive fine particles directly onto a substrate has been drawing attention, and various proposals have been made using the method.

For example, Japanese Laid-Open Patent Application No.2003-142802 (hereinafter referred to as "Patent Document 1") discloses a method of forming a linear pattern by coating a liquid containing pattern forming material onto a substrate in a manner where the linear pattern has at least one corner formed by at least two lines and a protruding part extending from the corner. That is, in a case where wiring is formed by coating ink onto a water-repellent substrate, problems such as disconnection may occur due to a large portion of the ink concentrating at a bent corner part of the wiring while only a small portion of the ink is provided at areas other than the corner part. However, with the Patent Document 1, ink can be prevented from concentrating at a corner since an intersection is formed at the corner by extending the wiring. Thereby, disconnection due to creation of a bulge (liquid reservoir) or short-circuiting can be prevented.

As another example, Japanese Laid-Open Patent Application No.2004-290958 (hereinafter referred to as "Patent Document 2") discloses a method for increasing the width of a film pattern including the steps of forming a center part of a film pattern by applying liquid droplets (Step 1), forming one side part with respect to the center part (Step 2), and forming the other side part with respect to the center part (Step 3). Since the droplets applied to the center part are either dry or highly viscous at the time of conducting Steps 2 and 3, droplets will not flow and concentrate even when liquid droplets are coated onto the side parts. Thus, bulges (liquid reservoirs) which tend to be formed when increasing the width of a pattern can be prevented from being created at an in-plane area of a substrate. Thereby, disconnection and short-circuiting can be prevented.

Although the methods disclosed in Patent Documents 1 and 2 can prevent a concentration of liquid droplets from causing short-circuiting and disconnection in an in-plane direction (between linear patterns, between film patterns) of a substrate, the methods cannot prevent bulging of liquid droplets at an end part (corner part) of wiring with respect to a cross-sectional direction of the substrate (film thickness direction). Therefore, in a case where an electrode pattern is provided on the above-described linear pattern or film pattern via an insulating layer, insulation failure may occur and result in short-circuiting of wires between the layers of a substrate.

As another example, Japanese Laid-Open Patent Application No.2004-335849 (hereinafter referred to as "Patent Document 3") discloses a method of forming a film pattern by jetting small diameter liquid droplets in a manner burying a groove part(s) of a wiring pattern. In forming a thin film pattern on a substrate with the method of Patent Document 3, liquid droplets are jetted in a manner so that droplets are not drawn together and are prevented from integrating with each other (forming of a bulge). With the film pattern formed by this method, acute areas can be prevented from being formed at the edge parts (side parts) of a wiring part. Thereby, generation of high frequency noise can be reduced.

Although the method disclosed in Patent Document 3 reduces generation of high frequency noise by burying the groove parts formed at side areas of a pattern formed by connecting liquid droplets in an in-plane direction of a substrate (as shown in FIGS. 1 and 2 of Patent Document 3), the method does not prevent bulging of liquid droplets in the cross-sectional direction (film thickness direction) of the substrate. Since this method is for forming thin film patterns while sequentially drying the droplets jetted onto a substrate so as to prevent forming of bulges, it is difficult to apply this method, which increases a wet area by integrating droplets jetted onto a predetermined thin film pattern area and then dries the wet area.

As another example, Japanese Laid-Open Patent Application No.2005-285843 (hereinafter referred to as "Patent Document 4") discloses a method of manufacturing a thin film transistor and a display device in which the number of times for conducting a photolithography process is reduced. Patent Document 4 concerns an invention of a shape of a gate electrode. In Patent Document 4, by forming a gate electrode into a shape having a concave part, displacement of a gate insulating film and a source/drain electrode (which are formed in a subsequent process) can be reduced. Although a schematic configuration of the electrode is shown in, for example, FIGS. 1-7 and FIGS. 9-12 of Patent Document 4, neither the problem of film bulging at end parts (particularly, corner parts) of an electrode when forming electrode layers with a printing method nor countermeasures for the problem are taken into consideration in Patent Document 4. Therefore, the problem of bulging or its countermeasures are not described in Patent Document 4.

As another example, in Japanese Laid-Open Patent Application No.2005-310962 (hereinafter referred to as "Patent Document 5"), the inventor of the present invention proposes a layered configuration which can easily form fine patterns with a printing method using a variable wettability material. The critical surface tension of the variable wettability material can change in accordance with energy applied thereto. For example, FIG. 1 and FIGS. 6-10 of Patent Document 5 are schematic views of a conductive layer of the layered configuration. However, in a case of forming a conductive pattern having a corner part(s) by applying liquid droplets (conductive liquid material), the problem of bulging of the conductive film at the corner part is not taken into consideration in Patent Document 5 and is not described in Patent Document 5. Therefore, insulation failure due to bulging of the conductive film tends to occur in a case where a layered wiring configuration is obtained by forming a wiring pattern on the above-described layered configuration via an insulating layer.

That is, in a case of forming a conductive pattern (hereinafter also simply referred to as "pattern") by applying a conductive liquid material (hereinafter also referred to as "ink")

to a variable wettability material having a critical surface tension (surface energy) that changes in accordance with energy applied thereto, ink becomes confined (trapped) in a high surface energy part (area having high surface energy) of the variable wettability material. Since the amount of ink at the vicinity of a center part of the pattern is greater than that of a peripheral area and the vapor pressure of the ink solvent of the ink contacting the atmosphere becomes higher toward the vicinity of a center part of the pattern, the evaporation rate of the ink becomes slower. That is, the amount of evaporation per unit of time becomes less. On the other hand, since the vapor pressure of the ink solvent of the ink contacting the atmosphere becomes lower toward the outer peripheral part of the pattern, the evaporation rate of the ink becomes faster. That is, the amount of evaporation per unit of time increases at the outer peripheral part of the pattern.

As shown with a plan view of FIG. 1, since ink covers only a small area at the corner parts of the pattern, the vapor pressure of the ink solvent of the ink contacting the atmosphere is particularly low at the corner parts. Therefore, the evaporation rate of the ink is extremely fast at the corner parts. In a case where ink is applied as a pattern to a high surface energy part of a variable wettability material, the difference of the evaporation rate between the corner parts of the pattern and other parts of the pattern causes ink to flow from an area having a slow evaporation rate (center part of the pattern) to an area having a fast evaporation rate (outer peripheral part (particularly, corner part) of the pattern). FIGS. 2A and 2B are for describing the flow of the ink, where FIG. 2A is a plan view of the variable wettability material and FIG. 2B is a cross-sectional view taken along line B-B of FIG. 2A. The lengths of the vertical arrows shown in FIG. 2B indicate the amount of evaporation at corresponding parts of the variable wettability material. FIG. 3 is a schematic diagram for describing the flow of ink by using isochronal lines in a case where ink is applied to a wettability area including a right-angle corner part.

FIG. 3 shows how ink evaporates at an outer peripheral part of the wettability area and flows toward an outer part (outer peripheral part) of the pattern. In FIG. 3, Part A indicates an area where the ink film thickness is large, and Part B indicates an area where the ink film thickness is particularly large. For example, in a case where time t=t4 elapses, line L4 in FIG. 3 reaches an outer peripheral part of the pattern. Accordingly, the solid content of ink located between the outer peripheral part and the line L4 begins to gather at the vicinity of the outer peripheral part and causes the film thickness of the outer peripheral part to increase. As shown in FIG. 3, since the distance between the line L4 and the outer peripheral part of the pattern at the corner part (in this example, Part B) is greater than the distance between the line L4 and the outer peripheral part of the pattern at a non-corner part (in this example, Part A), the amount of solid content gathering at the vicinity of the outer peripheral part increases. Thereby, the corner part (Part B) becomes thicker than the non-corner part (Part A). Thus, a projecting film thickness peak (convex protrusion) is formed at the corner part of the pattern. That is, a bulge is formed at the corner parts of the pattern, to thereby form a mountainous shape. It is to be noted that the bulges with large thicknesses may sometimes sink (cave in) after drying, to thereby form a concave part(s) in the film surface of the pattern.

For example, in a case where a conductive pattern including a right angle corner part is formed on a high surface energy part of a variable wettability layer, the film thickness increases at end parts and bending parts of the pattern (particularly, at corner areas of the end parts and bending parts) as illustrated with hatchings in FIG. 4. As a result, bulges are created at end parts and bending parts of the pattern (particularly, at corner areas of the end parts and bending parts). For a conductive pattern having a wide thickness distribution, the drying property and the baking property tend to significantly differ between a thick part and a thin part of the pattern. This results in inconsistent conductivity.

Furthermore, in a configuration having a conductive pattern layer formed on a high surface energy part of a variable wettability layer, that is, in a case of fabricating a layered wiring substrate by depositing a wiring pattern (conductive pattern) on an insulating film and forming an electrode layer (another conductive pattern layer) thereon, a large bulge in the thickness of the conductive pattern layer causes the insulating film to become relatively thin at the area of the bulge. That is, the space between the electrodes (conductive layers) becomes relatively narrow at the bulge and is reduced in insulation capability (see FIG. 5). Thereby, the electric field tends to concentrate at the bulging area. This leads to insulation breakdown of the insulating film and adversely affects the functions of the layered wiring substrate. FIG. 5 is a schematic diagram for describing how the electric field between electrodes tends to concentrate at the bulging area.

SUMMARY OF THE INVENTION

The present invention may provide a wiring pattern, an electronic device, an organic semiconductor device, a layered wiring pattern, and a layered wiring substrate using the wiring pattern that substantially obviates one or more of the problems caused by the limitations and disadvantages of the related art.

Features and advantages of the present invention are set forth in the description which follows, and in part will become apparent from the description and the accompanying drawings, or may be learned by practice of the invention according to the teachings provided in the description. Objects as well as other features and advantages of the present invention will be realized and attained by a wiring pattern, an electronic device, an organic semiconductor device, a layered wiring pattern, and a layered wiring substrate using the wiring pattern particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a wiring pattern including: a variable wettability layer including a material whose critical surface tension changes in response to energy provided thereto, the wettability changing layer including a high surface energy part exhibiting a high critical surface tension and a low surface energy part exhibiting a low critical surface tension; and a conductive pattern layer formed on the variable wettability layer at the high surface energy part; wherein the conductive pattern layer has an elongated shape with a chamfered corner part in a plan view.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

[Wiring Pattern]

Figure 6A:
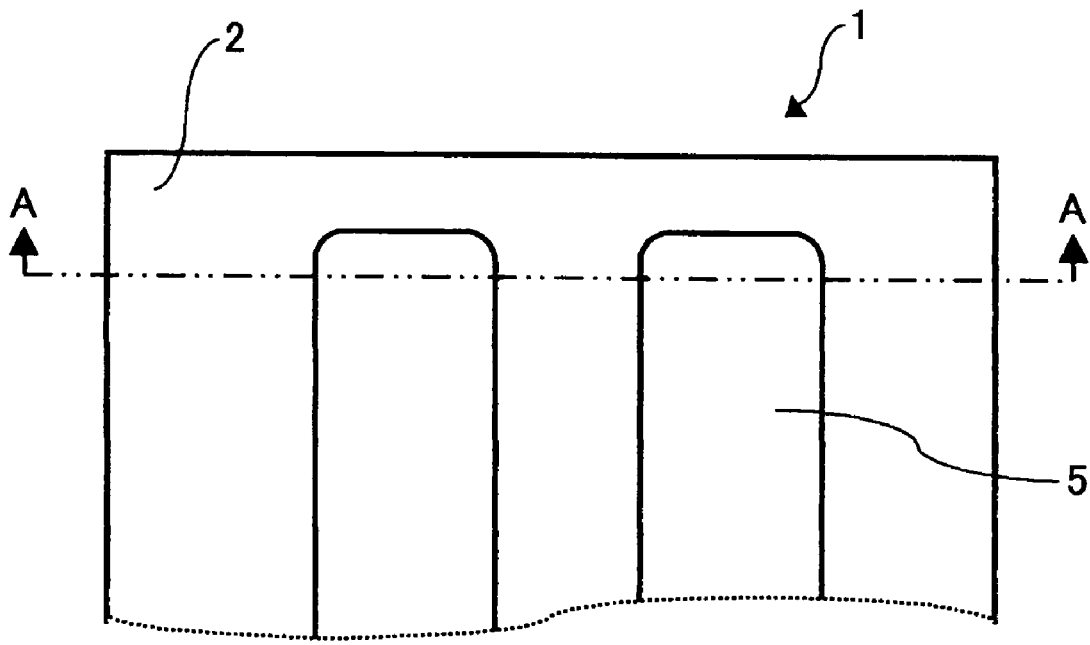
FIG. 6A is a partial plan view showing an exemplary configuration of a wiring pattern according to an embodiment of the present invention.
Figure 6B:
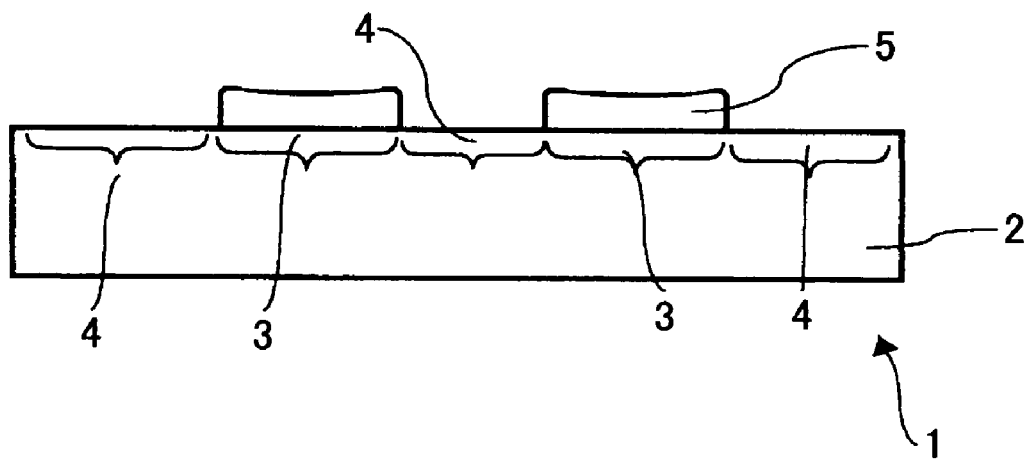
FIG. 6B is a cross-sectional view taken along line A-A of FIG. 6A.

FIG. 6A is a partial plan view showing an exemplary configuration of a wiring pattern 1, and FIG. 6B is a cross-sectional view taken along line A-A of FIG. 6A. The wiring pattern 1 shown in FIGS. 6A and 6B includes a configuration having conductive patterns (conductive pattern layer) 5 formed on high surface energy areas 3 of a variable wettability layer 2. The conductive pattern layer is formed with a conductive liquid. In other words, the variable wettability layer 2 includes the high surface energy areas 3 exhibiting a high critical surface tension when energy is applied thereto, low surface energy areas 4 having a low critical surface tension (no energy is applied to this area), and the conductive patterns 5 formed on the high surface energy areas 3. The high surface energy areas 3 are spaced apart with a fine gap (interval) of approximately 1 to 5 μm, for example. The variable wettability area 2 is formed with a material whose surface energy (i.e. critical surface tension) changes when energy is applied thereto.

Figure 1:
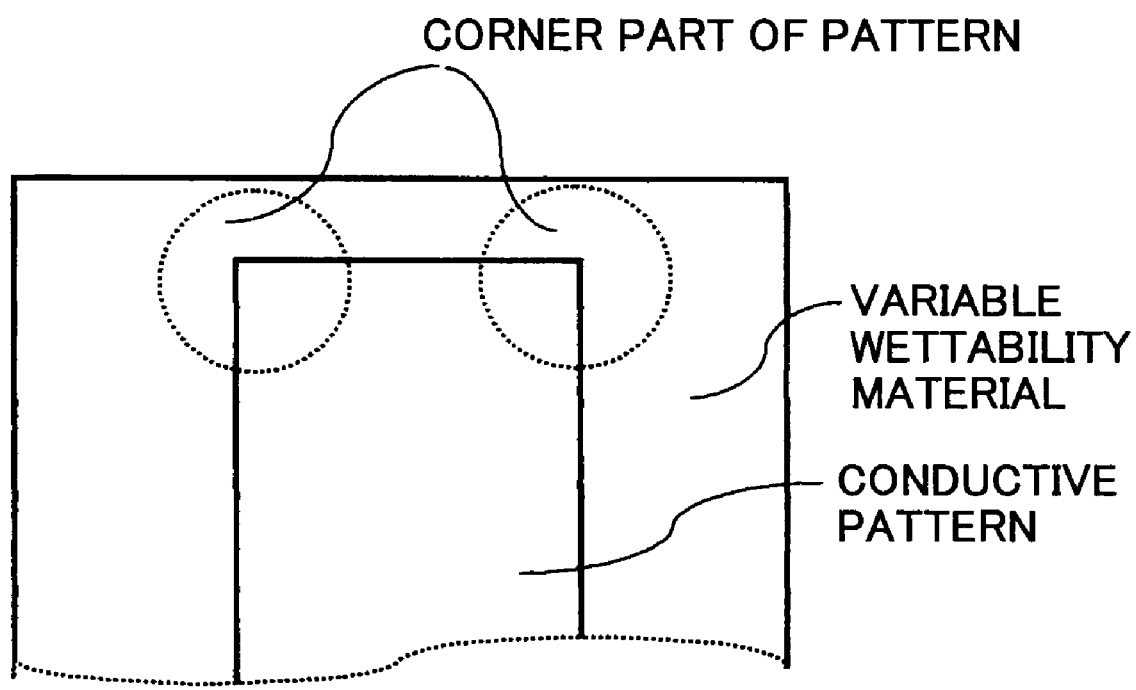
FIG. 1 is a partial plan view for describing a corner part of a conductive pattern.
Figure 2A:
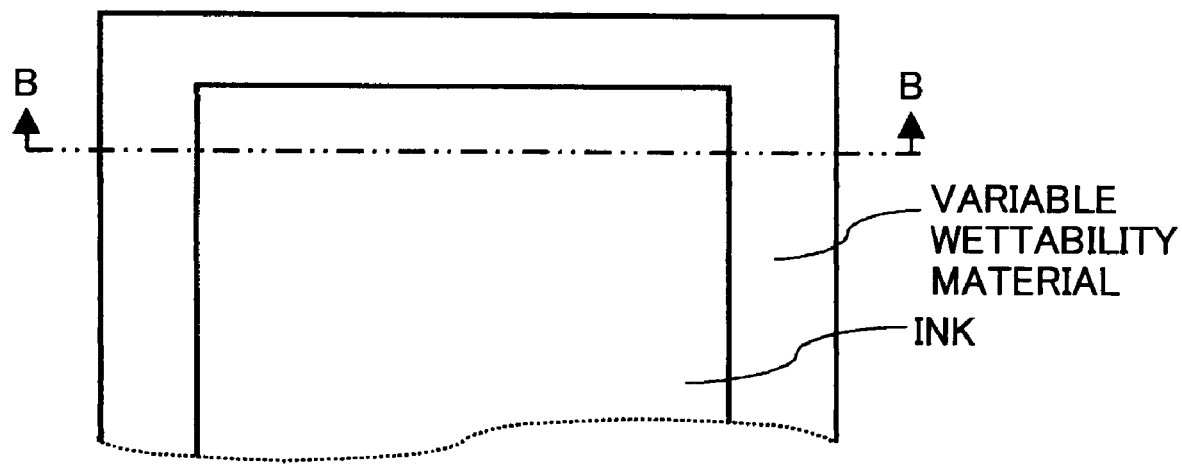
FIGS. 2A and 2B are a partial plan view and a cross-sectional view, respectively, for describing ink flowing from a center part of a pattern having a slow evaporation rate to an outer peripheral part of the pattern having a fast evaporation rate.
Figure 2B:
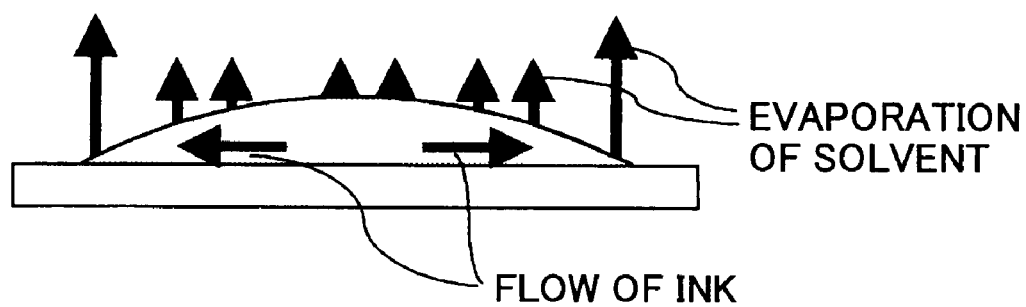
Figure 3:
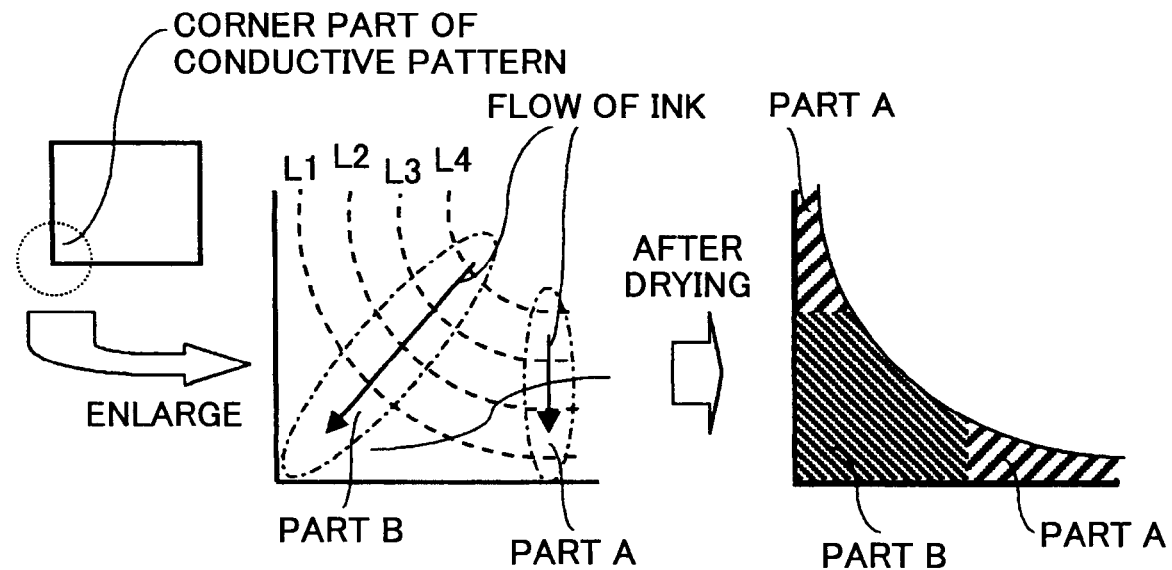
FIG. 3 is a schematic diagram using isochronal lines to illustrate the flow of ink in a case where ink is applied to a wettability area having a right angle corner part.
Figure 4:
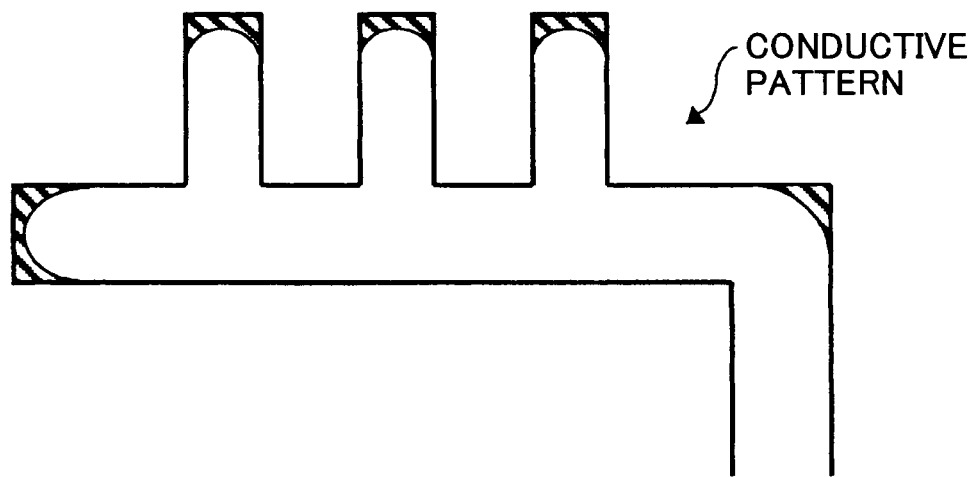
FIG. 4 is a schematic plan view showing a conductive pattern formed on a high surface energy part of a variable wettability layer in which a part of the conductive pattern bulges in a film thickness direction.
Figure 5:
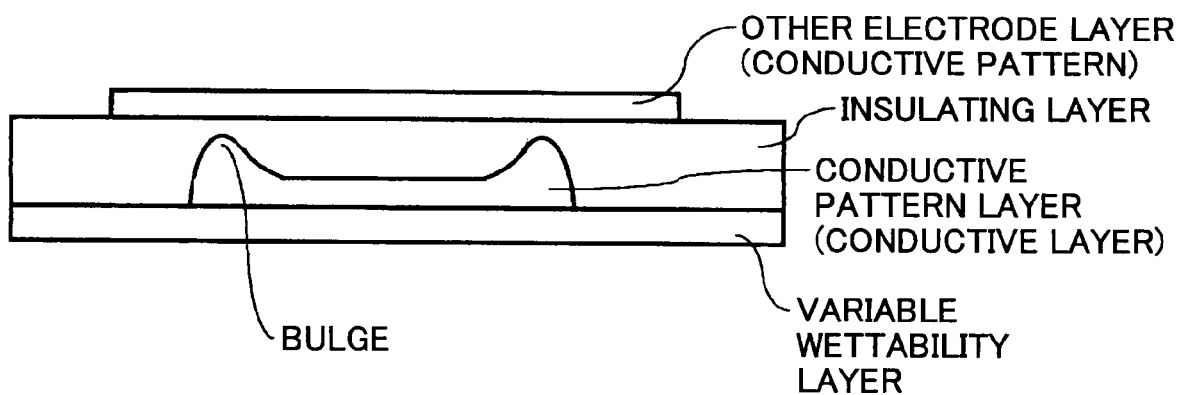
FIG. 5 is a schematic cross-sectional view for describing how electric field of a layered wiring substrate tends to concentrate in a case where there is a part of a conductive pattern bulges in a film thickness direction.
Figure 7A:
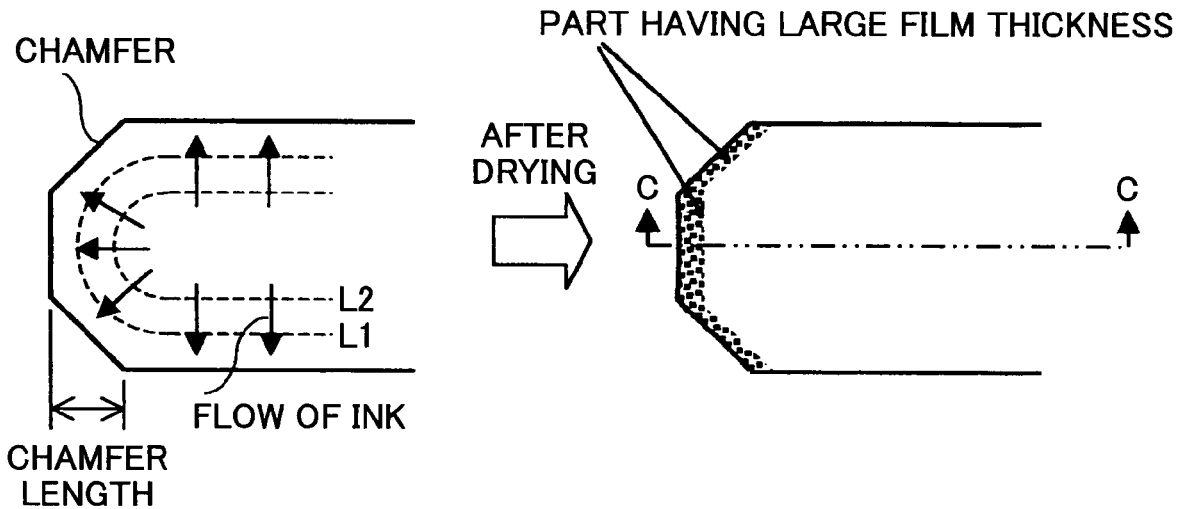
FIG. 7A is a partial plan view 7A and FIG. 7B is a cross-sectional view, respectively for describing characteristics of a conductive pattern according to an embodiment of the present invention.
Figure 7B:
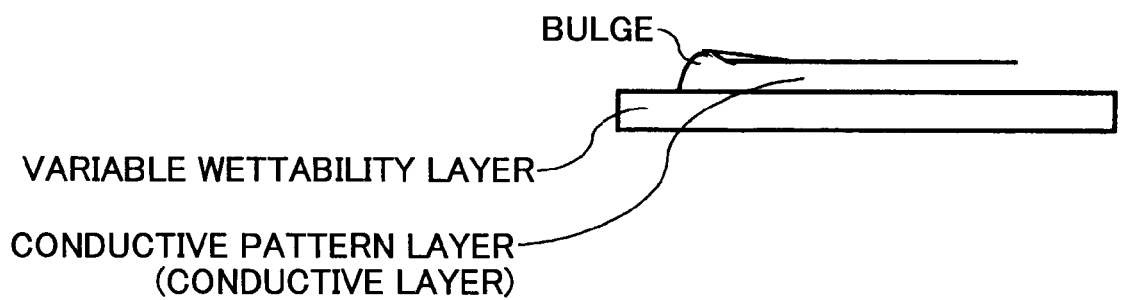

One characteristic of the conductive pattern 5 is that the conductive pattern 5 has elongated (rectangular) wiring with chamfered corner parts with respect to a plan view as shown FIG. 7A. Thus, with respect to a cross-sectional view as shown in FIG. 7B, the bulging at the corner parts of the conductive pattern 5 is reduced such that there is little overall three-dimensional ruggedness of the pattern is little. That is, the distance between the isochronal lines of ink flow and the outer peripheral part of the pattern becomes shorter (see FIG. 3), the unevenness of ink is reduced, and the differences of flow rate become smaller by chamfering the corner parts of the conductive pattern 5. Thereby, the bulging at the corner parts of the conductive pattern 5 can be reduced and the differences of film thickness (cross-section) of the entire pattern can be reduced.

It is to be noted that the conductive pattern 5 is formed (e.g. deposited) by drying or baking the ink.

Figure 8:
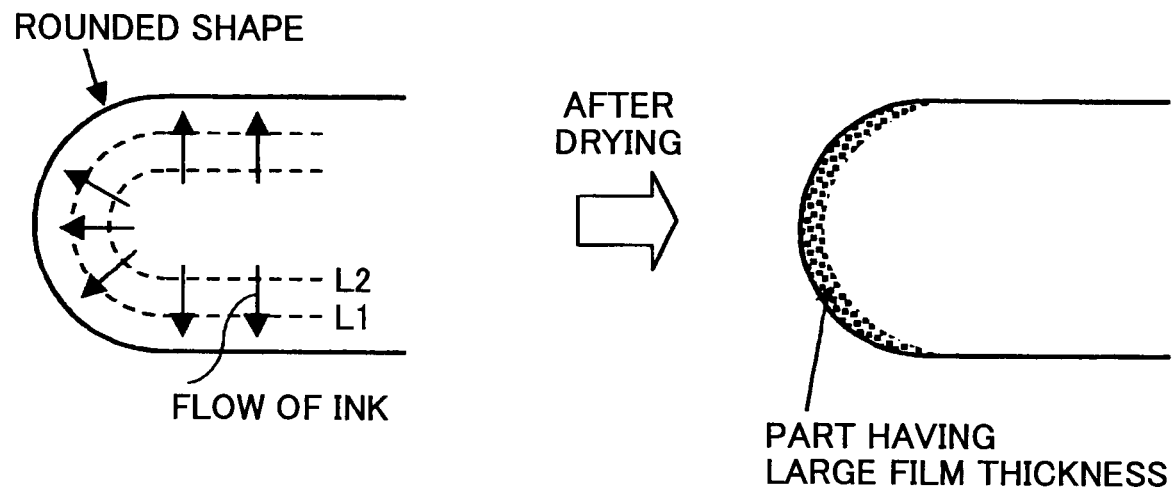
FIG. 8 is a partial plan view showing a case where a conductive pattern layer is chamfered into a rounded shape according to an embodiment of the present invention.
Figure 9:
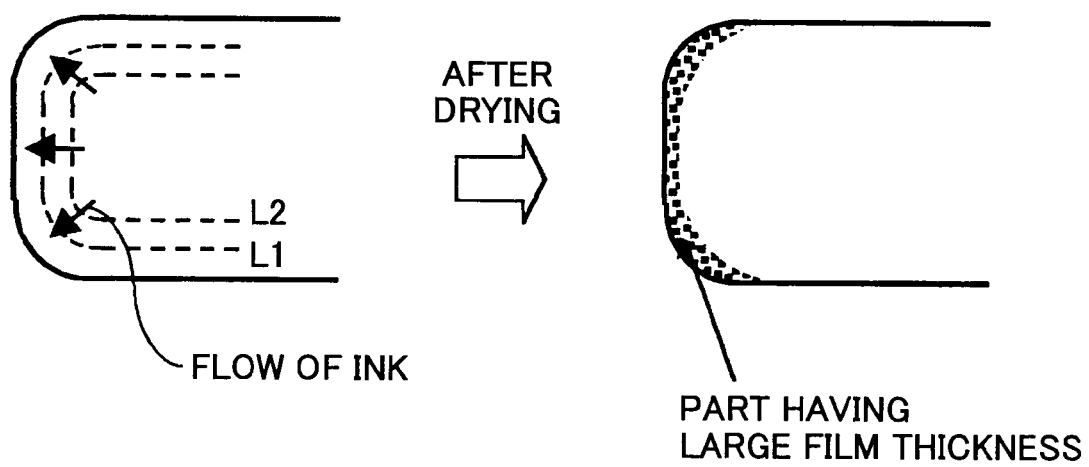
FIG. 9 is a partial plan view showing a case where a conductive pattern has its respective corner parts chamfered into a rounded shape according to an embodiment of the present invention.

In a case where the pattern is chamfered into a rounded shape (circular arc shape) as shown in FIG. 8, the isochronal lines of the ink flow become similar to the shape of the contour (outline) of the conductive pattern 5. This further reduces the unevenness of the ink. Thereby, the bulging at the corner parts of the conductive pattern 5 can be further reduced and the differences of film thickness (cross-section) of the entire pattern can also be further reduced. Alternatively, the conductive pattern 5 may be rounded at its respective corner parts rather than rounding the entire end part of the conductive pattern 5 as shown in FIG. 9.

By forming a wiring pattern having the above-described configuration, the corner parts of the conductive pattern 5 can be formed with a small film thickness (bulge) and sunken (caved in) areas due to an increase of film thickness can be prevented from being generated, to thereby prevent concave parts from being formed in the wiring pattern. Accordingly, the peak of the film thickness of the conductive pattern 5 is moderate and the conductive pattern 5 can be formed with little ruggedness (three-dimensionally). Accordingly, even where another electrode (conductive pattern layer) is formed on the conductive pattern (conductive pattern layer) via an insulating layer, insulation failure can be prevented from occurring. By using a low cost printing method which is capable of using materials efficiently, the above-described wiring pattern can be fabricated with fine high precision conductive patterns. Thus, such conductive patterns can be used in various electronic devices, organic semiconductor devices, layered wiring patterns, and layered wiring substrates.

Figure 10:
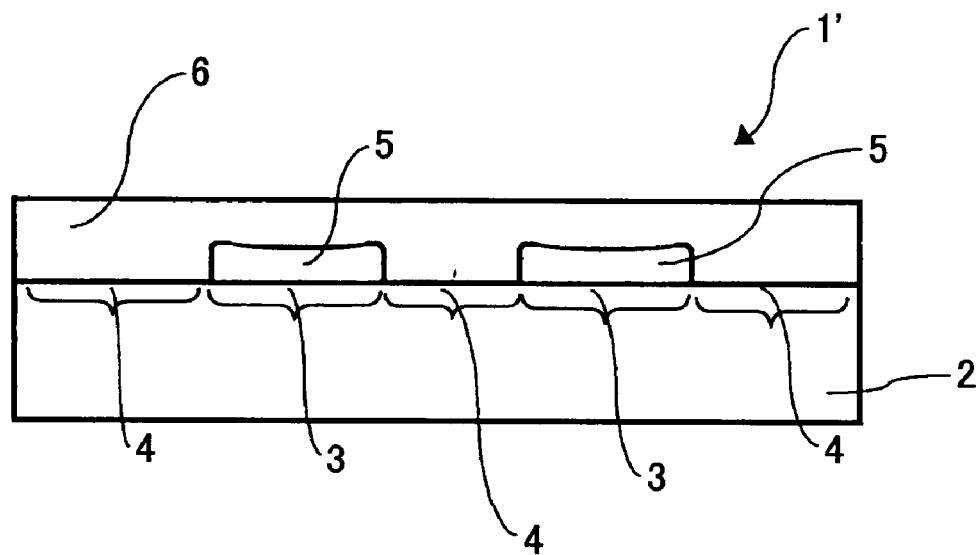
FIG. 10 is a schematic cross-sectional view showing a wiring pattern according to an embodiment of the present invention where a semiconductor layer is formed in a manner contacting the low surface energy parts shown in FIGS. 6A and 6B.

As shown in the cross-sectional view of FIG. 10, a wiring pattern 1' may be formed having a semiconductor layer 6 contacting the variable wettability layer 2 including the low surface energy area 4 shown in FIG. 6. With the wiring pattern 1' having such a configuration, satisfactory interface characteristics can be attained between the variable wettability layer 2 and the semiconductor layer 6, to thereby obtain a wiring pattern having a semiconductor layer with high mobility. Furthermore, in a case where an organic semiconductor layer is used, the variable wettability layer 2 can significantly improve the characteristics of the organic semiconductor layer (described in detail below), to thereby obtain a wiring pattern having a semiconductor layer with greater mobility.

Furthermore, another wiring pattern having another conductive pattern may be formed on the above-described wiring pattern via an insulating layer.

Figure 11:
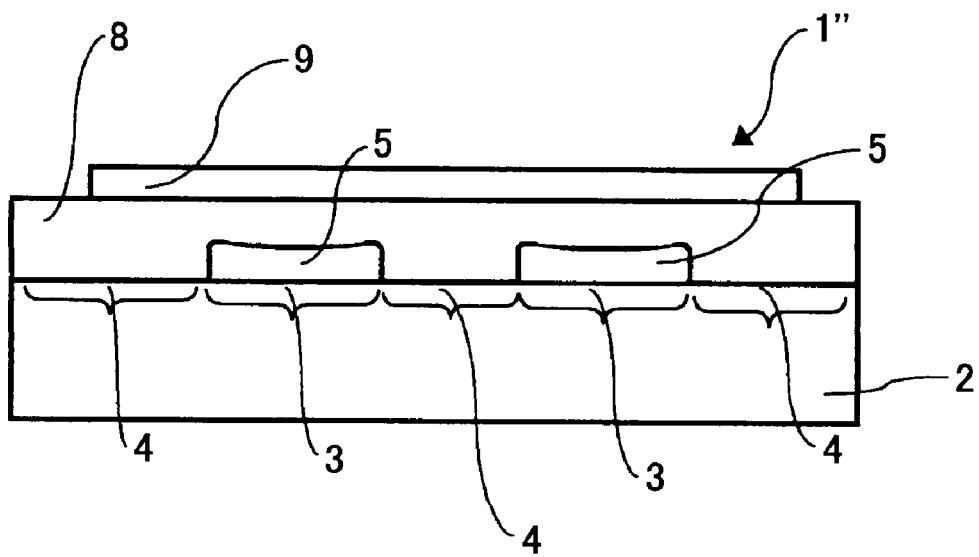
FIG. 11 is a schematic cross-sectional view showing a wiring pattern according to another embodiment of the present invention where another conductive pattern is formed on a low surface energy part via an insulating layer.

FIG. 11 is a cross-sectional view of a wiring pattern 1". The wiring pattern 1" has another conductive pattern 9 formed on the above-described configuration shown in FIG. 6 (wiring pattern 1 having a conductive patterns 5 formed on high surface energy areas 3 of the variable wettability layer 2) via an insulating layer 8. The configuration of the wiring pattern 1" can be suitably used for a layered wiring pattern or a layered wiring substrate.

Although not illustrated, another wiring pattern may be configured having a semiconductor layer formed in a manner contacting the low surface area of FIG. 10. By forming a configuration having another conductive pattern on the above-described wiring pattern via an insulating layer, the configuration can be suitably used for various electronic devices, for example, a diode, a transistor, a photoelectric conversion device, and a thermoelectric transducer. The electronic devices can be manufactured at a lower cost by forming another wiring pattern where the variable wettability layer itself is used as an insulating layer.

Next, the variable wettability layer is described in detail.

As described above, the variable wettability layer 2 shown in FIGS. 6A and 6B is formed with a material whose critical surface tension (surface energy) changes according to energy applied thereto. The material of the variable wettability layer 2 may be a single material or a combination of two or more kinds of materials. For example, in a case of forming a variable wettability layer 2 with a combination of two or more materials, the variable wettability layer 2 having a satisfactory insulating property and a satisfactory wettability changing property can be obtained by mixing a material having a high insulating property and a material with a high wettability changing property.

Furthermore, even if a material has a high wettability changing property but a poor deposition characteristic, such material can be used as one of the materials for forming the variable wettability layer 2 since the variable wettability layer 2 can be formed by mixing two or more kinds of materials. Therefore, a greater variety of materials can be selected for forming the variable wettability layer 2. More specifically, in a case where, for example, one material has a high wettability changing property but a cohesive force (which makes deposition difficult), such material can be mixed with another material having a superior deposition characteristic so that a suitable variable wettability layer 2 can be formed.

Figure 12:
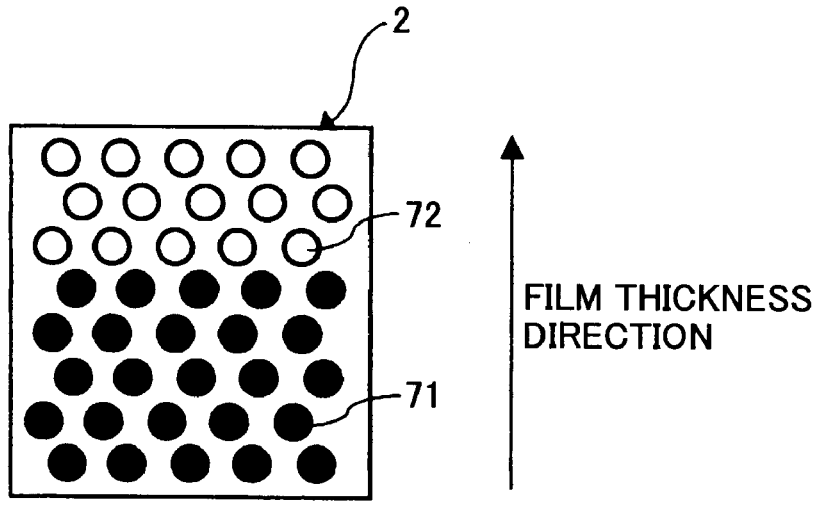
FIG. 12 is a schematic cross-sectional view showing a configuration of a variable wettability layer according to an embodiment of the present invention.

FIG. 12 is a schematic diagram showing a cross section of the variable wettability layer 2 formed with two kinds of materials (first material 71 and second material 72) according to an embodiment of the present invention. As shown in FIG. 12, the variable wettability layer 2 may have, for example, a configuration that is distinctly divided into a layer formed of the first material 71 (first material layer) and another layer formed of the second material 72 (second material layer) in which the second material layer is formed on top of the first material layer. In this example, the first material 71 has a better insulating property than the second material 72 while the second material 72 has a better wettability changing property than the first material 71.

Such a configuration can be fabricated by sequentially forming one layer after another (in this example, forming the second material layer after forming the first material layer). Such a configuration can be fabricated by using, for example, a vacuum process (vacuum deposition) or a coating process using a solvent.

Figure 13:
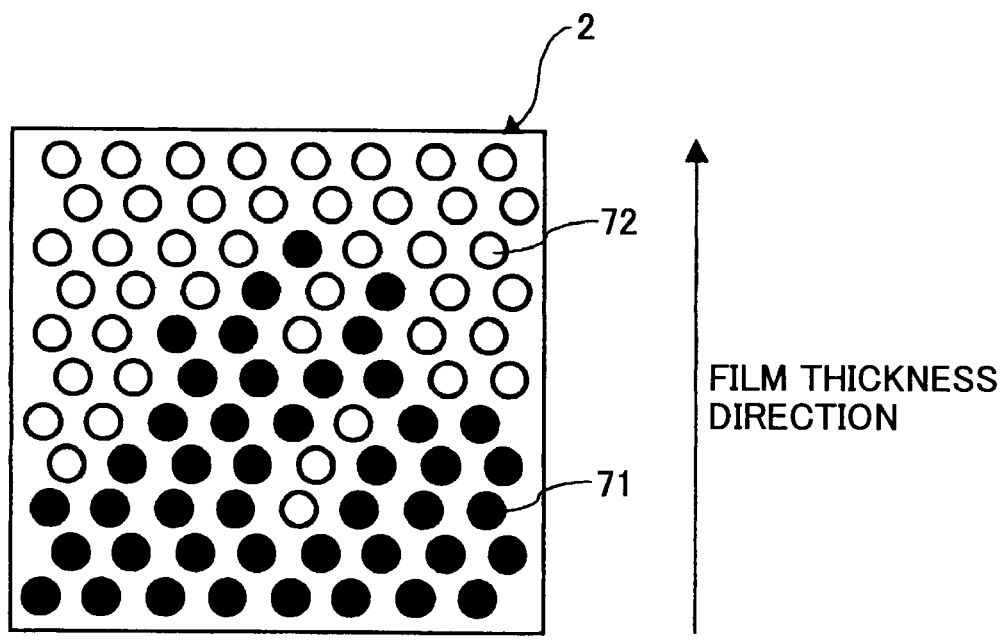
FIG. 13 is a schematic cross-sectional view showing another configuration of a variable wettability layer according to an embodiment of the present invention.

Such a configuration may also be fabricated by coating a substrate with a mixed solution containing the first and second materials 71, 72 and drying the coated substrate. This method is used, for example, in a case where the second material 72 has a relatively low polarity or a case where the second material has a low molecular weight, so that the second material 72 contained in the mixed solution can migrate toward the surface of the variable wettability layer 2 as the solvent evaporates by drying. As shown in FIG. 13, the first material layer formed of the first material 71 and the second material layer formed of the second material 72 are not distinctly divided at their interface in a case where the coating process is used.

According to an embodiment of the present invention, the percentage of the composition of the first material 71 having a better insulating property compared to the second material 72 and the second material 72 having a better wettability changing property compared to the first material 71 (first material 71/second material 72) ranges from 50/50 to 99/1 by weight. As the weight ratio of the second material 72 increases, the insulating property of the variable wettability layer 2 decreases. Therefore, in a case of fabricating an electronic device, the variable wettability layer 2 is unsuitable for an insulating layer. On the other hand, as the weight ratio of the first material 71 increases, the wettability changing property decreases. Therefore, a conductive layer cannot be formed with a satisfactory pattern(s). Thus, the mixture ratio (first material 71/second material 72) preferably ranges from 60/40 to 95/5, and more preferably from 70/30 to 90/10.

As shown in FIG. 13, the first material layer formed of the first material 71 and the second material layer formed of the second material 72 do not necessarily need to be distinctly divided at their interface.

Figure 14:
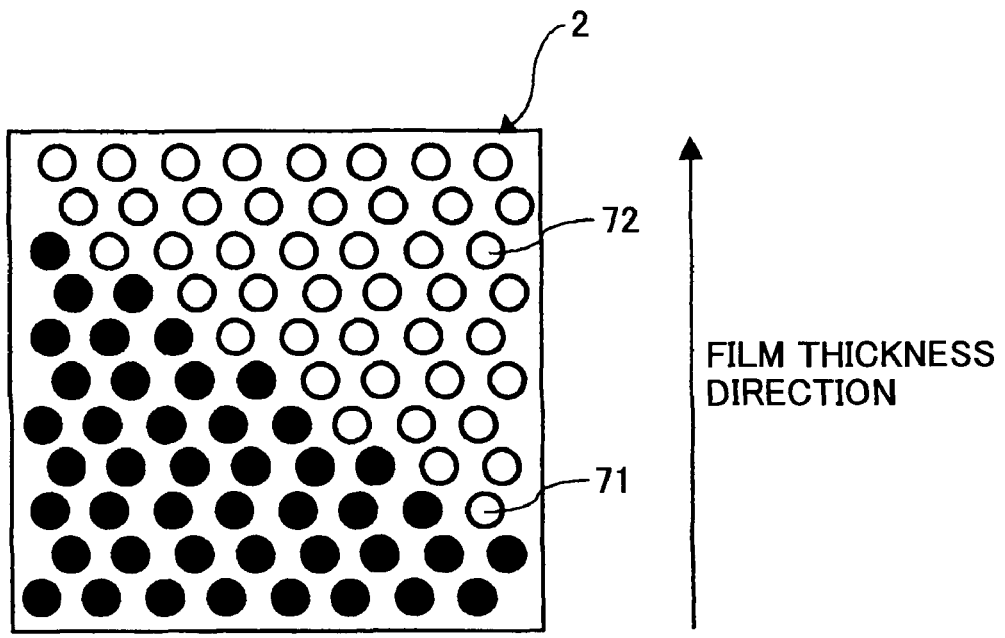
FIG. 14 is a schematic cross-sectional view showing yet another configuration of a variable wettability layer according to an embodiment of the present invention.

Furthermore, as shown in FIGS. 13 and 14, the mixture of the first and second materials 71 and 72 may be distributed with a predetermined density with respect to the thickness direction of the variable wettability layer 2. That is, in a case where the variable wettability layer 2 comprises two or more kinds of materials, the variable wettability layer 2 may have two or more layers. Instead of having a layered configuration, the variable wettability layer 2 may have its materials arranged with a predetermined density distribution.

Figure 15:
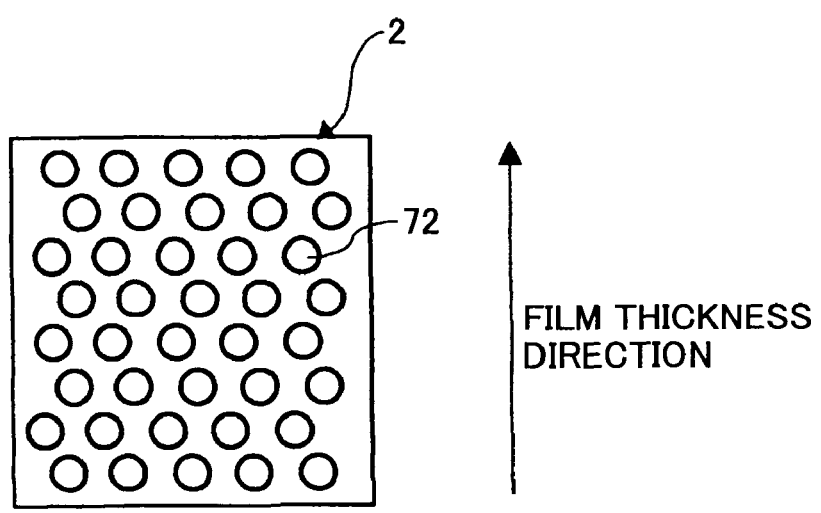
FIG. 15 is a schematic cross-sectional view showing a configuration of a surface of a variable wettability layer according to an embodiment of the present invention.

As shown in FIG. 15, it is preferable that the variable wettability layer 2 have the second material particles 72 evenly scattered (distributed) at one surface of the variable wettability layer 2 (a surface not contacting the substrate (not shown)).

Figure 16:
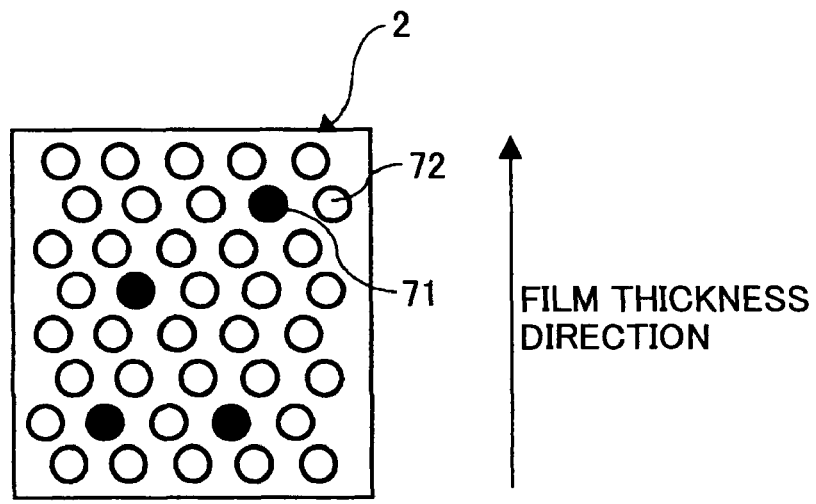
FIG. 16 is a schematic cross-sectional view showing another configuration of a surface of a variable wettability layer according to an embodiment of the present invention.
Figure 17:
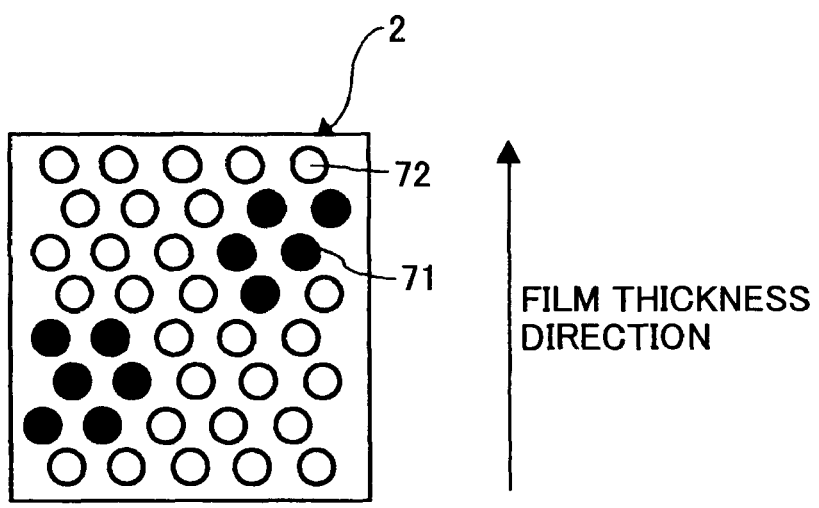
FIG. 17 is a schematic cross-sectional view showing yet another configuration of a surface of a variable wettability layer according to an embodiment of the present invention.

In a case where fine patterning can be executed (i.e. forming fine patterns), the variable wettability layer 2 may have the first material particles 71 scattered (distributed) among the evenly scattered (distributed) second material particles 72 as shown in FIG. 16. Alternatively, the variable wettability layer 2 may have the first material particles 71 scattered in groups among the second material particles 72 to form a sea-island structure as shown in FIG. 17.

In the above-described FIG. 6, the layer comprising the conductive pattern 5 (conductive layer) is obtained by applying a conductive liquid containing conductive material (e.g., ink) to a high surface energy area of the variable wettability layer 2 and hardening (solidifying) the applied conductive liquid by applying, for example, heat or UV rays.

In this example, the conductive liquid containing conductive material (e.g., ink) may be i) a liquid having a conductive material dissolved in a solvent, ii) a liquid having a precursor of a conductive material or the precursor dissolved in a solvent, iii) a liquid having particles of a conductive material dispersed in a solvent, or iv) a liquid having precursor particles of a conductive material dispersed in a solvent.

More specifically, the conductive liquid containing conductive material (e.g., ink) may include fine metal particles (e.g., Ag, Au, Ni) dispersed in an organic solvent or water. Alternatively, the conductive liquid containing conductive material (e.g., ink) may include an aqueous solution of a conductive high polymer material having doped PANI (polyaniline) or PSS (poly styrene sulfonic acid) doped in PEDOT (polyethylene dioxythiophene).

Since the ink applied onto the high surface energy area of the surface of the variable wettability layer 2 is needed to spread and wet the high surface energy area in order to form the conductive pattern 5, the ink is to have a low viscosity to the extent of wetting and spreading on the high surface energy area (wettability area) when applied to the surface of the variable wettability layer 2. Although the range of suitable viscosity may slightly change depending on the drying speed of the ink, the viscosity of the ink is preferably 100 mPa·s or less, and more preferably 50 mPa·s. By attaining such viscosity, the ink can suitably wet and spread on the high surface area of the variable wettability layer 2. Thereby, a suitable conductive pattern can be formed.

As described above, the variable wettability layer 2 includes a material whose critical surface tension changes by applying energy (e.g., heat, UV rays, electron rays, plasma) thereto. Therefore, the critical surface tension of the material of the variable wettability layer is preferred to significantly change when energy is applied thereto. By applying energy to predetermined parts of the variable wettability layer 2, a pattern having different critical surface tension parts can be formed on the surface of the variable wettability layer 2 including the high surface energy area 3 and the low surface energy area 4. Accordingly, a conductive liquid containing a conductive material (ink) can easily adhere (lyophilic) to the high surface energy area (i.e. lyophilic area) 3 and cannot easily adhere (lyophobic or hydrophobic) to the low surface energy area (i.e. lyophobic area) 4. Thus, by selectively applying ink to the high surface energy area 3 in accordance with the pattern formed on the surface of the variable wettability layer 2 and hardening the applied ink, a conductive layer 5 can be formed.

It is preferable to use a method of irradiating UV rays for applying energy to the above-described areas of the variable wettability layer 2 considering the aspects of a) being controllable in an atmospheric environment, b) being capable of obtaining high resolution, and c) causing little damage to the inside of the variable wettability layer 2.

Next, the wettability of a liquid with respect to a solid surface, in other words, adhesiveness is briefly described.

Figure 18:
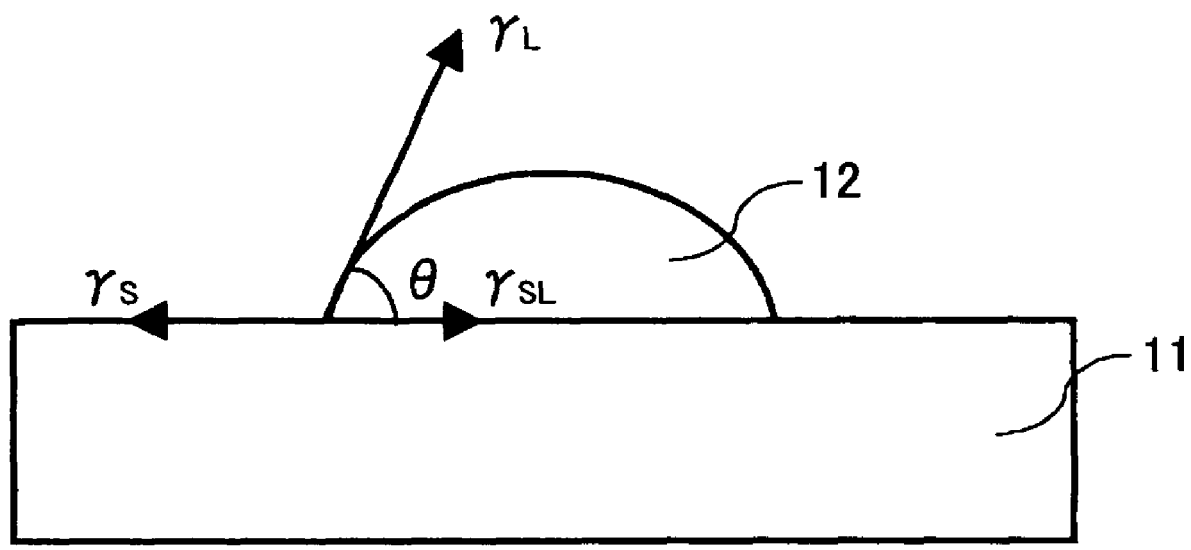
FIG. 18 is a schematic diagram for describing wettability of a liquid with respect to a solid surface.

FIG. 18 is a schematic diagram showing a liquid droplet 12 contacting the surface of a solid 11 in a case where the liquid droplet 12 is in equilibrium when its contact angle is θ degrees. The configuration shown in FIG. 18 satisfies the following Young's equation (Equation 1).

$$\gamma_S = \gamma_{SL} + \gamma_L \cos\theta \quad \text{(Equation 1)}$$

In Equation 1, "$\gamma_S$" indicates the surface tension of the solid 11, "$\gamma_{SL}$" indicates the interfacial tension between the solid 11 and the liquid (liquid droplet 12), and "$\gamma_L$" indicates the surface tension of the liquid (liquid droplet 12).

Surface tension has substantially the same meaning as surface energy and is expressed with an equal value as surface energy. In a case where $\cos\theta=1$, θ becomes 0° and the liquid (liquid droplet 12) becomes completely wet. In this case, the value of $\gamma_L$ becomes $\gamma_S - \gamma_{SL}$. This is referred to as the critical surface tension $\gamma_C$ of the solid 11. The critical surface tension $\gamma_C$ can be easily determined by using various liquids whose surface tensions are already known, plotting the relationship between surface tension and contact angle, and calculating a surface tension satisfying a relationship of $\theta=0°$ ($\cos\theta=1$) (Zisman plot). In a case where the surface of the solid 11 exhibits a high critical surface tension $\gamma_C$, the liquid (liquid droplet 12) has a wettable tendency (lyophilic). In a case where the surface of the solid 11 exhibits a low critical surface tension $\gamma_C$, the liquid (liquid droplet 12) does not have a wettable tendency (lyophobic).

It is easy to measure contact angle θ by using a sessile drop method. The sessile drop method includes:

(a) a tangential method in which a contact angle is read by aiming a microscope towards the liquid droplet 12 and matching a cursor line of the microscope with a tangential point of the liquid droplet 12;

(b) a θ/2 method in which a contact angle is obtained by matching a cross-shaped cursor to an apex of the liquid droplet 12 and multiplying the angle of a cursor line two times when matching one tip to a contacting point between the liquid droplet 12 and a specimen of the solid 11;

(c) a three point clicking method in which a contact angle is obtained by displaying an image of the liquid droplet 12 on a monitor and clicking a single point located on the circumference of the liquid droplet 12 (preferably the apex) and the contact points (two points) between the liquid droplet 12 and a specimen of the solid 11, and using a computer to process data according to the clicked points. The precision of the methods for measuring the contact angle becomes higher in an order of (a)→(b)→(c).

Figure 19:
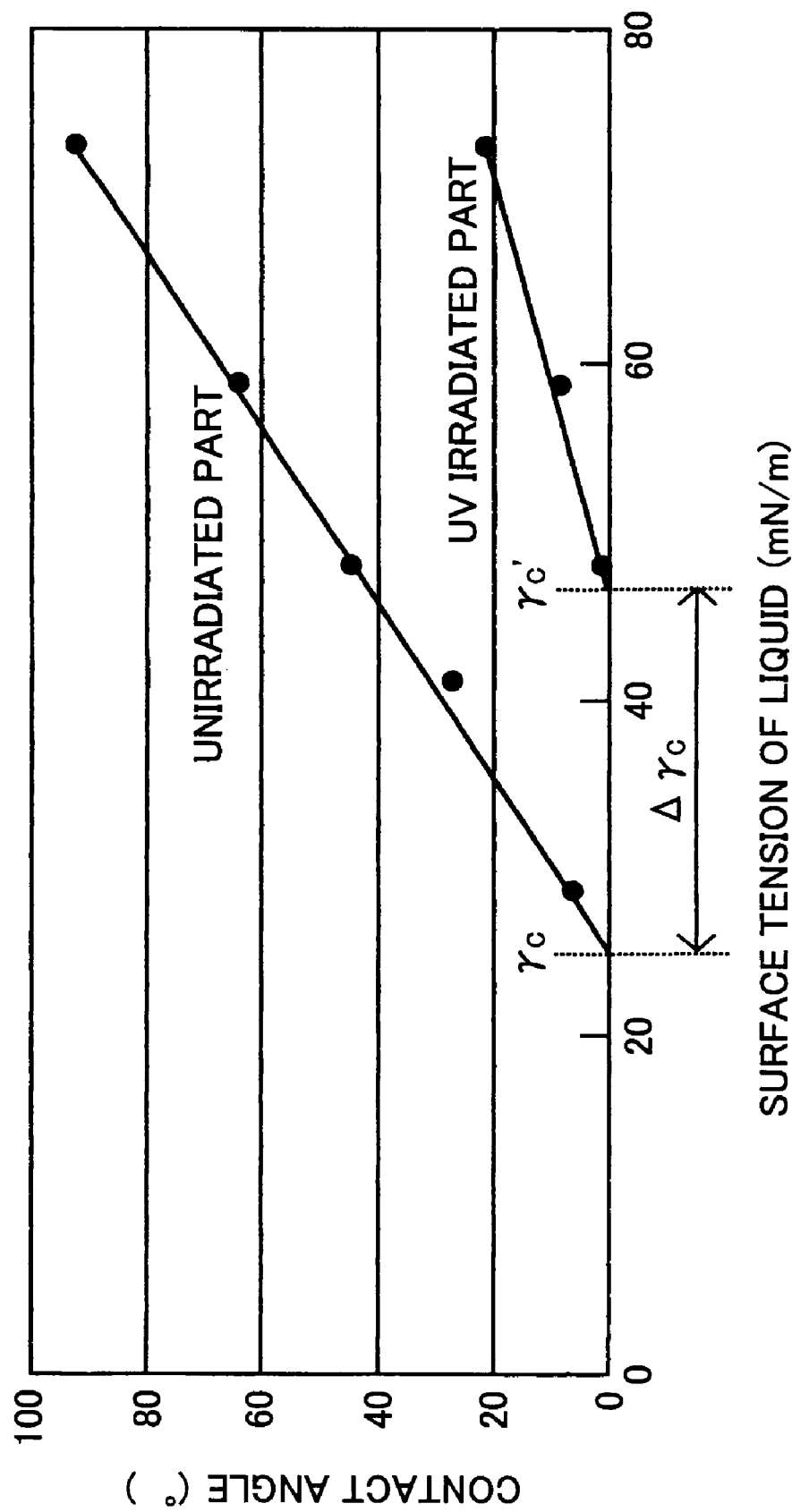
FIG. 19 is a graph showing characteristics of surface tension and contact angle in a case where a polyimide with sides chains is used as a variable wettability layer in which a Zisman plot is performed on a part irradiated with UV rays and a part not irradiated with UV rays according to an embodiment of the present invention.

FIG. 19 is a graph showing results of performing a Zisman plot on a UV irradiated part(s) and a UV unirradiated part(s) in a case where a polyimide with side chains (structural formula (VI), described below in First Example) is used as the variable wettability layer 2 according to an embodiment of the present invention. FIG. 19 shows that the critical surface tension $\gamma_C$ of the UV unirradiated part is approximately 24 mN/m, the critical surface tension $\gamma_C$ of the UV irradiated part is approximately 45 mN/m, and the difference of the two critical surface tensions $\Delta\gamma_C$ is approximately 21 mN/m.

In order for a conductive liquid containing a conductive material (ink) to securely adhere only at the lyophilic high surface energy areas 3 according to the pattern of the high surface energy areas 3 and the low surface energy areas 4, a large difference of surface energy between the irradiated part and the unirradiated part is desired. In other words, a large critical surface energy difference $\Delta\gamma_C$ is desired.

The below Table 1 shows the results of evaluating the surface energy difference $\Delta\gamma_C$ between the irradiated part (part to which energy is applied, hereinafter also referred to as "energy-applied part") and the unirradiated part (part to which no energy is applied, hereinafter also referred to as "energy-unapplied part") and the selective adhesiveness of polyaniline (aqueous conductive polymer) in a case where various materials are used to form the variable wettability layer 2 on a glass substrate. The evaluation of the selective adhesiveness is conducted by dropping an aqueous solution of polyaniline to an area including a border of a pattern between the energy-applied part and the energy-unapplied part and observing whether polyaniline has adhered to the energy-unapplied part (pattern failure) after removing the remaining liquid solution. In Table 1, material A indicates polyvinyl phenol (Maruka Lyncur M, manufactured by Maruzen Petrochemical), material B indicates polyimide (RN-1024, manufactured by Nissan Chemical Industries), material C indicates fluoroalkyl acrylate polymer (AG-7000, manufactured by Asahi Glass), and material D indicates polyimide with side chains (PIX-X491-E01, manufactured by Chisso). Furthermore, in Table 1, "X" indicates large amount of polyaniline adhered to the energy-unapplied part, "○" indicates some polyaniline adhered to the energy unapplied part, and "⊚" indicates no polyaniline adhered to the energy-unapplied part.

TABLE 1

| MATERIAL | ENERGY | Δγc | GRADE OF PATTERN |
| --- | --- | --- | --- |
| A | UV RAY | 6 mN/m | X |
| B | UV RAY | 10 mN/m | ○ |
| C | HEAT | 15 mN/m | ⊚ |
| D | UV RAY | 21 mN/m | ⊚ |

The results of Table 1 show that the difference between the critical surface tension of the low surface energy area 4 and the critical surface tension of the high surface energy area 3 ($\Delta\gamma_C$) of the variable wettability layer 2 is preferred to be 10 mN/m or more, and more preferably 15 mN/m or more.

With the wiring pattern according to an embodiment of the present invention, the wiring pattern can be configured having a semiconductor layer 6 contacting the low surface energy area 4 of the variable wettability layer 2 as shown in FIG. 10. Since the semiconductor layer 6 contacts the low surface energy area 4 of the variable wettability layer 2, it is believed that the physical properties of the contacting area affect the characteristics of the semiconductor layer 6.

Figure 20:
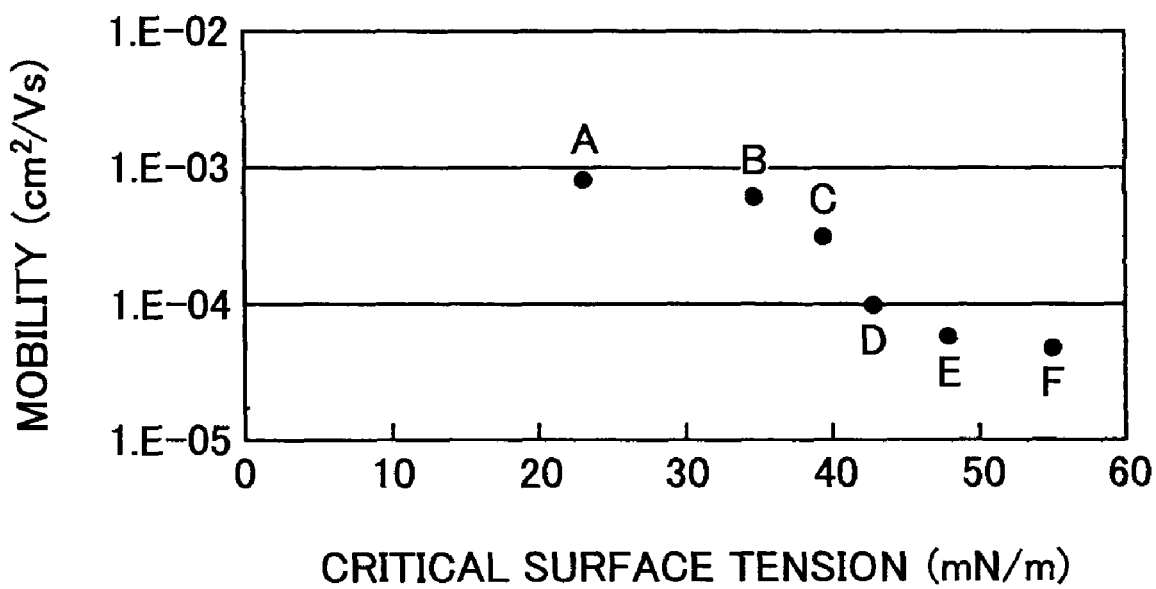
FIG. 20 is a graph showing characteristics of critical surface tension and mobility of an electronic device (TFT) in a case where the electronic device is fabricated by using various materials as the material of the variable wettability layer.

FIG. 20 is a graph showing the mobility of an electronic device having a TFT structure (described below with FIG. 23) with respect to the critical surface tension $\gamma_C$ of the variable wettability layer 2 of the electronic device in a case where various materials are used to form the variable wettability layer 2.

Figure 23:
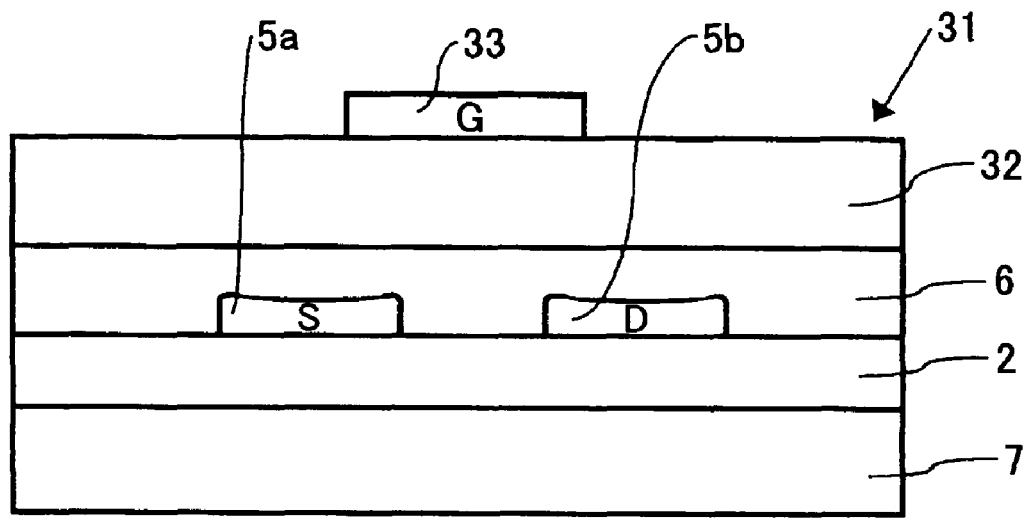
FIG. 23 is a cross-sectional view showing an exemplary configuration of an electronic device according to an embodiment of the present invention.

In FIG. 20, material "A" indicates polyimide with side chains, material "B" indicates polyvinyl phenol, material "C" indicates organic silica, material "D" indicates thermal oxidation film, material "E" indicates polyimide, and material "F" indicates $SiO_2$ (sputtered film). It is to be noted that the source electrode 5a and the drain electrode 5b shown in FIG. 23 are formed by lifting off an Au deposited film.

FIG. 20 shows that the mobility of the electronic device suddenly decreases when the critical surface tension $\gamma_C$ surpasses 40 mN/m. Based on this result, it is desired that the critical surface tension $\gamma_C$ of the low surface energy area 4 of the variable wettability layer 2 be no greater 40 mN/m.

In a case where the critical surface tension ($\gamma_C$) is less than 20 mN/m, most solvents would be repelled by the variable wettability layer 2. Therefore, in a case of forming the semiconductor layer 6 by using a coating method, the variable wettability layer 2 is desired to have a critical surface tension ($\gamma_C$) of 20 mN/m or more.

Figure 21:
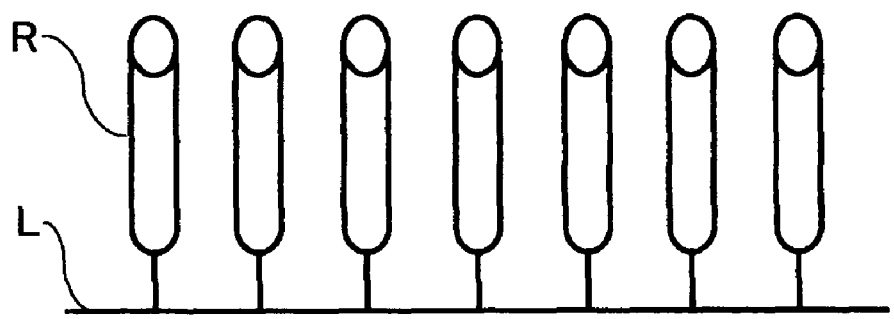
FIG. 21 is a schematic diagram showing a polymer material having a hydrophobic group as its side chain according to an embodiment of the present invention.

It is also desired to use a polymer material having a hydrophobic group as its side chain for the variable wettability layer 2. More specifically, as shown in the schematic diagram of FIG. 21, it is desired to use a material including a main chain L having a structure of, for example, polyimide or (meta) acrylate directly or indirectly (i.e. via a linkage group, not shown) combined with a side chain R having a hydrophobic group.

The hydrophobic group may be a group having an end structure of, for example, —$CF_2CH_3$, —$CF_2CF_3$, —$CF(CF_3)_2$, —$C(CF_3)_3$, —$CF_2H$, or —$CFH_2$. It is preferable to use a group having a long carbon chain for easily orientating the molecular chains. A group having a carbon number of no less than four is more preferable. Furthermore, it is preferable to use a polyfluoroalkyl group which has two or more hydrogen atoms of an alkyl group substituted for with fluorine atoms (hereinafter also referred to as "Rf group"). It is more preferable to use an Rf group having a carbon number ranging from 4-20 (more preferably, 6-20). Although the Rf group may have a straight chain structure or a branched chain structure, it is preferable for the RG group to have a straight chain structure. Furthermore, a perfluoroalkyl group having substantially all of its hydrogen atoms substituted for with fluorine atoms may also be preferable as the hydrophobic group. A group expressed with $C_nF2_{n+1}$—(n being an integer ranging from 4 to 16) is preferred as the perfluroalkyl group (more preferably, a group where n is an integer ranging from 6 to 12). Although the perfluoroalkyl group may have a straight chain structure or a branched chain structure, it is preferable for the RG group to have a straight chain structure.

The above-described material of the variable wettability layer 2 is described more specifically in, for example, Japanese Laid-Open Patent Application No.3-178478. The material exhibits a lyophilic property when heated while contacting a liquid or a solid, and exhibits a lyophobic property when heated in an atmospheric environment. This shows that the critical surface tension of a material can be changed depending on the selected contacting medium and the thermal energy applied.

The hydrophobic group may also be a group having an end structure without fluoride atoms, for example, —$CH_2CH_3$, —$CH(CH_3)_2$, or —$C(CH_3)_3$. It is also preferable to use a group having a long carbon chain for easily orientating the molecular chains. A group having a carbon number of no less than four is more preferable. Although the hydrophobic group may have a straight chain structure or a branched chain structure, it is preferable for the hydrophobic group to have a straight chain structure. The above-described alkyl group may include a halogen atom(s), a cyano group, a phenyl group, a hydroxyl group, a carboxyl group, or a phenyl group substituted for with a linear, branched, or cyclic alkyl group or alkoxy group having a carbon number ranging from 1 to 12. The more linked parts of R there are, the lower the surface energy of the material becomes (the critical surface tension becomes smaller) and the material becomes hydrophobic. It is assumed that applying energy such as irradiation of UV rays causes part of the linkage to break or change orientation, to thereby increase critical surface tension and lyophilic property.

In a case of forming a semiconductor layer 6 on a variable wettability layer 2 (see FIG. 22), the polymer material having a hydrophobic group with side chains is preferred to include polyimide. In a case of forming the semiconductor layer 6 on the variable wettability layer 2, the use of a solvent or temperature change caused by baking would not cause problems such as swelling or cracking.

Furthermore, in a case of forming the variable wettability layer 2 with two or more kinds of materials, the materials other than the polymer material having a hydrophobic group with side chains are also preferred to include polyimide considering the aspects of heat-resistance, solvent-resistance, and affinity.

As for the polyimide having a hydrophobic group with side chains according to an embodiment of the present invention, there is a material derived from, for example, a diamine compound expressed with the below general formulas (amino group omitted) or an acid anhydride.

the same or different. Likewise, in a case where "n" is 2, the two "V"s may be the same or different.

[Formula 3]

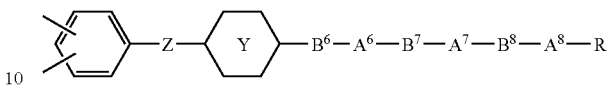

(III)

In Formula 3: linking group "Z" represents $CH_2$, CFH, $CF_2$, $CH_2CH_2$, or $CF_2O$; ring "Y" represents 1,4-cyclohexylene or 1,4-phenylene in which 1 to 4 H atoms may be substituted for with F or $CH_3$; "$A_6$" through "$A_8$" independently represent a single bond, 1,4-cyclohexylene or 1,4-phenylene in which 1 to 4 H atoms may be substituted for with F or $CH^3$; "$B^6$" through "$B^8$" independently represent a single bond, alkylene having 1 to 4 carbon atoms, an oxygen atom(s), oxyalkylene having 1 to 3 carbon atoms, alkylene oxide having 1 to 3 carbon atoms; and "R" represents alkyl having 1 to 10 carbon atoms in which H or a given $CH_2$ may be substituted for with $CF_2$, alkoxy having 1 to 9 carbon atoms in which one $CH_2$ may be substituted for with $CF_2$, or alkoxyalkyl. The linking position of the amino group with respect to the benzene ring is a given location. However, in a case where "Z" represents $CH_2$, "$B^6$" through "$B^8$" do not all represent

[Formula 1]

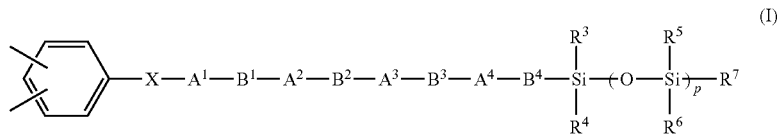

(I)

In Formula 1: "X" represents —$CH_2$— or $CH_2CH_2$—. "$A^1$" represents 1,4-cyclohexylene, 1,4-phenylene, or 1,4-phenylene substituted for with 1 to 4 fluorine atoms; "$A^2$", "$A^3$", and "$A^4$" independently represent a single bond, 1,4-cyclohexylene, 1,4-phenylene, or 1,4-phenylene substituted for with 1 to 4 fluorine atoms; "$B^1$", "$B^2$", and "$B^3$" independently represent a single bond or $CH_2CH_2$—; "$B^4$" represents alkylene having 1 to 10 carbon atoms; "$R^3$", "$R^4$", "$R^5$", "$R^6$", and "$R^7$" independently represent alkyl having 1 to 10 carbon atoms; and "p" represents an integer that is no less than 1.

[Formula 2]

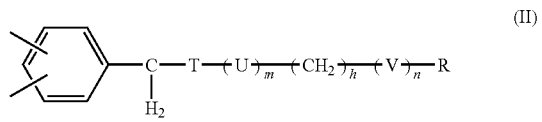

(II)

In Formula 2: "T" "U" and "V" independently represent a benzene ring or a cyclohexane ring in which a given "H" in the rings may be substituted for with an alkyl having 1 to 3 carbon atoms, a fluoro-substituted alkyl having 1 to 3 carbon atoms, F, Cl, or CN; "m" and "n" independently represent an integer ranging from 0 to 2; "h" represents an integer ranging from 0 to 5; and "R" represents a H, F, Cl, CN or a monovalent organic group. In a case where "m" is 2, the two "U"s may be alkylene having 1 to 4 carbon atoms at the same time. In a case where "Z" represents $CH_2CH_2$ and ring Y represents 1,4-phenylene, "$A^6$" and "$A^7$" do not both represent a single bond. In a case where "Z" represents $CF_2O$, ring Y does not represent 1,4-cyclohexylene.

[Formula 4]

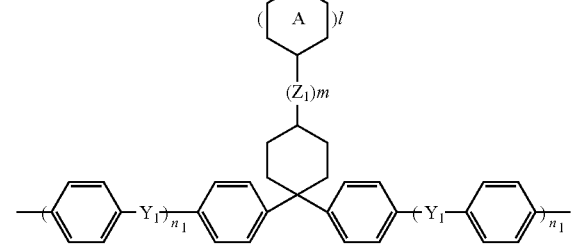

(IV)

In Formula 4: "R2" represents an alkyl group having hydrogen atoms or 1 to 12 carbon atoms; "$Z_1$" represents a $CH_2$ group; "m" represents 0 to 2; ring "A" represents a benzene ring or a cyclohexane ring; "l" represents 0 or 1; "$Y_1$" independently represents an oxygen atom(s) or a $CH_2$ group; and "$n_1$" independently represents 0 or 1.

[Formula 5]

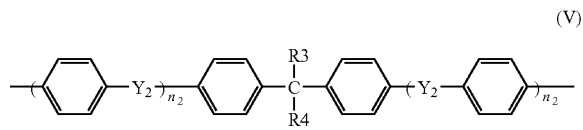

(V)

In Formula 5, "$Y_2$" independently represents an oxygen atom(s) or a $CH_2$ group; "R3" and "R4" independently represent a hydrogen atom(s), an alkyl group having 1 to 12 carbon atoms, a perfluoroalkyl group in which at least one of "R3" and "R4" represents an alkyl group having 3 or more carbon atoms or a perfluoroalkyl group; and "$n_2$" independently represents 0 or 1.

Details regarding the above-described compounds are described in Japanese Laid-Open Patent Application Nos.2002-162630, 2003-96034, and 2003-267982.

One example of acid anhydride may be tetracarboxylic dianhydride in which various kinds of materials may be used such as aliphatic materials, alicyclic materials, and aromatic materials. More specifically, pyromellitic dianhydride, cyclobutane tetracarboxylic dianhydride, and butane tetracarboxylic dianhydride. Other materials disclosed in, for example, Japanese Laid-Open Patent Application Nos.11-193345, 11-193346, and 11-193347 may be used.

As described above, a polyimide having a hydrophobic group derived from a diamine compound expressed with the above-described general formulas 1 to 5 may be of a single bond or mixed with other materials. In a case of mixing with other materials, the other material is preferred to also be a polyimide in view of heat-resistance, solvent-resistance, and affinity.

The polyimide having a hydrophobic group derived from a diamine compound may be expressed with general formulas other than the above-described general formulas 1 to 5.

As for other effects (advantages) attained by arranging a material with side-chains having a hydrophobic group (R) at the surface, the semiconductor layer 6 (as shown in FIG. 10) contacting the material can attain satisfactory interfacial characteristics with respect to the contacting material. Such an effect becomes more noticeable in a case where the semiconductor layer 6 comprises an organic semiconductor.

Here, satisfactory interfacial characteristics may be:
a) in a case where the semiconductor is a crystalline substance, the crystal grain of the semiconductor becomes larger and mobility of the semiconductor increases;
b) in a case where the semiconductor is an amorphous substance (polymer), the interface density of the semiconductor decreases and the mobility of the semiconductor increases; and
c) in a case where the semiconductor is a polymer with a side-chain of a long chain alkyl group or the like, the orientation may be constrained such that the molecular axis of the pi($\pi$)-conjugated main chain is oriented substantially in a single direction and the mobility of the semiconductor increases.

The thickness of the variable wettability layer 2 according to an embodiment of the present invention preferably ranges from 30 nm to 3 μm (more preferably, from 50 nm to 1 μm). A thickness below 30 nm reduces characteristics of the variable wettability layer 2 serving as a bulk material, such as insulating characteristics, gas barrier characteristics, and moisture proof characteristics. A thickness higher than 3 μm is also not preferable since such thickness adversely affects the form of the surface of the variable wettability layer 2.

There are various coating methods for applying the conductive liquid containing a conductive material (ink) to the surface of the variable wettability layer 2, such as a spin coating method, a dip coating method, a screen printing method, an offset printing method, and inkjet method. The inkjet method, which is capable of supplying fine liquid droplets, is preferable for making effective use of the surface energy with respect to the variable wettability layer 2. In a case of performing an inkjet method by using an ordinary inkjet head for a printer, the resolution is 30 μm and the alignment precision is approximately ±15 μm. However, finer patterns can be formed on the variable wettability layer by using the differences of surface energy of the variable wettability layer 2.

Since the present invention is able to reduce differences of film thickness (pattern thickness) at the vicinity of the pattern after ink applied to the variable wettability layer 2 becomes dry, various methods for forming a pattern (patterning method) may be used as long as the patterning method enables ink to wet and spread on the surface of the variable wettability layer 2.

The material used for the semiconductor layer 6 may be an inorganic semiconductor (e.g., CdSe, CdTe, Si). Alternatively, the material used for the semiconductor layer 6 may be an organic semiconductor including an organic low molecular material (e.g., pentacene, antracene, tetracene, phthalocyanine), a polyacetylene type polymer, a polyphenylene type conductive polymer (e.g., polyparaphenylene and its derivatives, polyphenylene-vinylene and its derivatives), a heterocyclic type conductive polymer (e.g., polypyrrole and its derivatives, polythiophene and its derivatives, polyfuran and its derivatives), or an ionic conductive polymer (e.g., polyaniline and its derivatives). As described above, characteristics of the variable wettability layer 2 become more noticeable in a case where the semiconductor layer 6 comprises an organic semiconductor.

Figure 22:
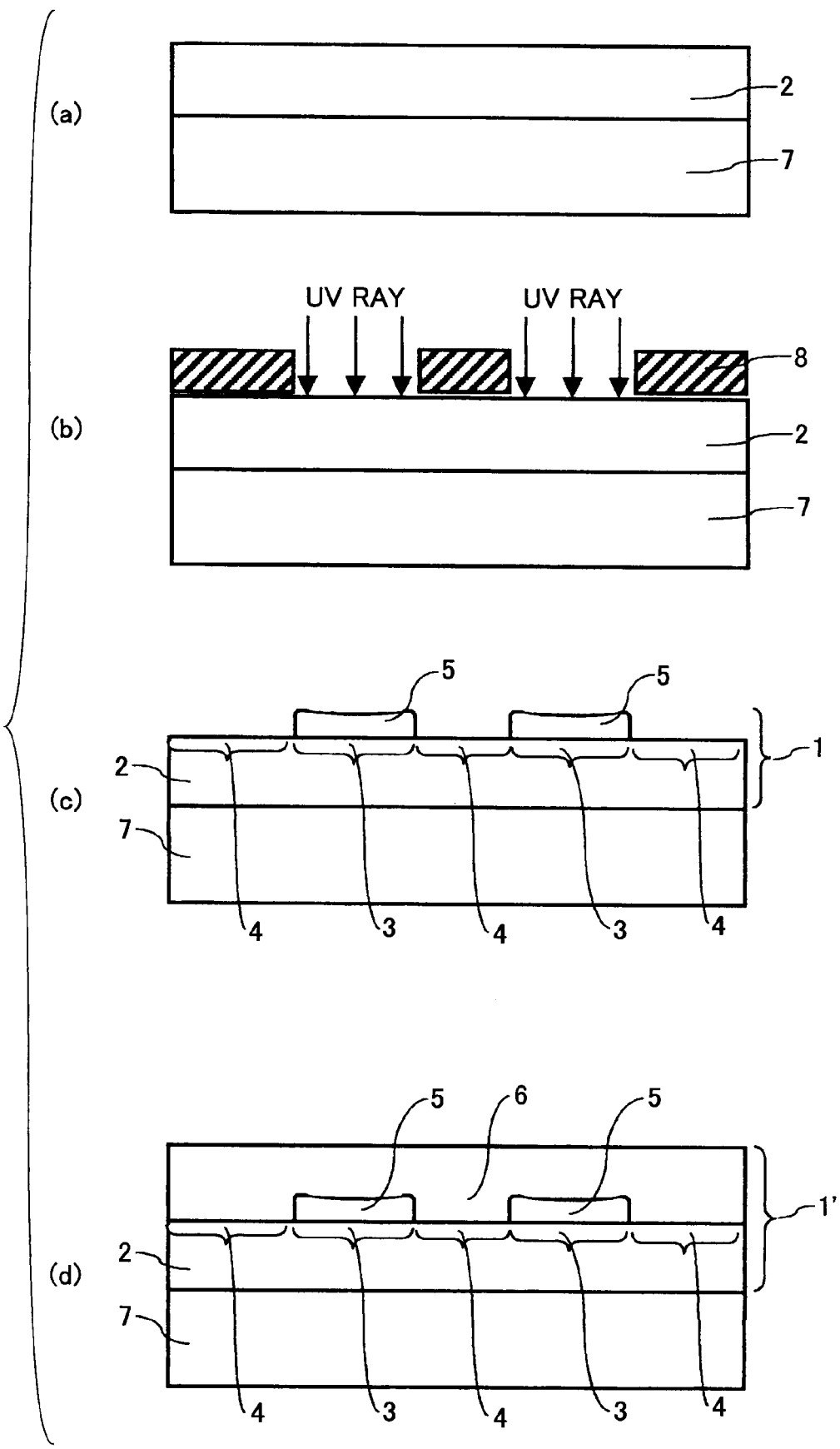
FIGS. 22($a$)-22($d$) are cross-sectional views showing steps for fabricating a wiring pattern according to an embodiment of the present invention.

The wiring pattern according to an embodiment of the present invention is fabricated by performing the steps (processes) shown in the cross-sectional views of FIG. 22.

As shown in FIG. 22(a), the variable wettability layer 2 is formed on a substrate 7. The material of the substrate 7 may be, for example, a glass material, a plastic material (e.g., polycarbonate, polyarylate, polyethersulfone), a silicon wafer, or a metal material. In this example, the variable wettability layer 2 is formed of a material whose critical surface tension increases when UV rays are applied thereto. That is, when UV rays are irradiated onto the variable wettability layer 2 formed with the material, the irradiated part of the variable wettability layer 2 changes from a low surface energy state (lyophobic state) to a high surface energy state (lyophilic state). As described above, according to an experiment by the inventor of the present invention, it is found that a material including a main chain having a polyimide skeleton structure with a side chain of a long chain alkyl group particularly exhibits a significant wettability change when UV rays are irradiated thereto.

A solution including the polyimide structure material is applied and dried on the surface of the substrate 7, to thereby form the variable wettability layer 2. The solution may be applied to the surface of the substrate 7 by using, for example, a spin coating method, a dip coating method, wire-bar coating method, or a cast coating method. The solution may be a polymer including the material or its precursor dissolved or dispersed in an organic solvent or the like. Vertical agents used for liquid crystal display devices may be used as the solution (e.g., PIA-X491-E01 of Chisso Corporation, SE-1211 of Nissan Chemical Industries Limited, JALS-2021 of JSR).

Next, in the step of FIG. 22(b), UV rays are irradiated to the surface of the variable wettability layer 2 via a mask 8. Thereby, a pattern including the low surface energy parts 4 and the high surface energy parts 3 is formed. In the UV irradiation process, it is preferable to use UV rays having a relatively short wavelength of 100-300 nm.

Next, in the step of FIG. 22(c), a conductive liquid containing a conductive material (ink) is supplied to the variable wettability layer 2 formed with the foregoing pattern by using, for example, an ink-jet process. Thereby, the conductive layer 5 is formed selectively on the high surface energy part 3.

By performing the above-described processes, a wiring pattern according to an embodiment of the present invention is formed on the substrate 7.

Finally, as shown in FIG. 22(d), the semiconductor layer 6 is formed by depositing a low molecular semiconductor material on the structure shown in FIG. 22(c) in a manner contacting the surface of the variable wettability layer 2 including the low surface energy part 4. Alternatively, the semiconductor layer 6 may be formed by applying a solution dissolving therein a polymer semiconductor material or a precursor thereof by using, for example, a spin coating method, a dip coating method, a wire-bar coating method, or a casting method, and then drying the solution on the variable wettability layer 2. Thereby, fabrication of the wiring pattern 1' is completed.

Accordingly, a layered wiring pattern or a layered wiring substrate can be fabricated by forming an insulating layer and another conductive pattern on the wiring pattern 1 (FIG. 22(c)). Furthermore, an electronic device such as a diode, a transistor, a photoelectric conversion device, or a thermoelectric conversion device can be fabricated by forming another conductive pattern on the wiring pattern 1', that is, having the variable wettability layer 2 provided as an intermediate layer or an insulating layer formed on an organic semiconductor layer.

FIG. 23 shows an electronic device 31 according to an embodiment of the present invention. The electronic device 31 is a field effect transistor implemented in the form of a TFT (Thin Film Transistor).

Referring to FIG. 23, the substrate 7 and the variable wettability layer 2 are substantially identical to those described above. Thus, the patterns of the low surface energy part 4 and the high surface energy part 3 are formed in the wettability layer 2, and a pair of electrode layers 5a and 5b is formed on the high surface energy part 3 as a conductive layer, by applying a conductive liquid that contains a conductive material (ink).

For the conductive liquid containing the conductive material (ink), it is possible to use one in which fine metal particles of Ag, Au, Ni, and the like are dispersed in an organic solvent or water. Alternatively, it is possible to use an aqueous solution of conductive polymer such as doped polyaniline (PANI) or polyethylene dioxythiophene (PEDOT) doped with polystyrene sulfonate (PSS). It is to be noted that the precision of the gap between the electrode layers 5a and 5b becomes the key for the performance of the electron device of the present embodiment. Thus, since the present invention allows a pattern of the low surface energy part 4 and high surface energy part 3 to be formed with high precision, it is possible to secure high precision for the electrode layers 5a and 5b, irrespective of the method (apparatus) used for supplying the conductive liquid.

Further, the semiconductor layer 6 is formed thereon by, for example, a spin coating method, a dip coating process, or a casting. For the semiconductor layer 6, it is particularly preferable to use an organic semiconductor material.

Further, an insulating layer 32 is formed on the semiconductor layer 6 by, for example, an evaporation deposition method, a CVD method, a spin coating method, a dip coating method, or a cast method. An inorganic insulator or an organic insulator can be used for the insulating layer 32.

In the case where the semiconductor layer 6 includes an organic semiconductor material, it is necessary to choose the method of forming the insulating layer 32 such that damage to the semiconductor layer 6 is avoided. For example, it is preferable to avoid the use of high temperature or high energy ions, active radicals, or solvents capable of dissolving the organic semiconductor material when forming the insulating layer 32. From this viewpoint, it is preferable to use, for example, $SiO_2$ formed by an evaporation deposition process, a water-soluble PVA (polyvinyl alcohol), an alcohol-soluble PVP (polyvinyl phenol), or a perfluoro polymer soluble in a fluorine solvent Finally, an electrode layer 33 is formed on the insulating layer 32 by, for example, an evaporation deposition method, a CVD method, a spin-coating method, a dip-coating method, or a casting method.

Further, it is possible to use various conductive films for the electrode layer 33. In this case, the conductive film is formed uniformly, followed by a patterning process conducted by an ordinary photolithographic method. Alternatively, the conductive material may be patterned by a micro contact printing method. Further, it is possible to form the pattern of the conductive material by injecting the liquid containing the conductive material by an ink-jet method.

As shown from FIG. 23, the electronic device 31 functions as a TFT (thin film transistor). Thus, the electrode layers 5a and 5b function as source electrode and drain electrode, the insulating film 32 functions as a gate insulating film and the electrode layer 33 functions as a gate electrode. Thereby, the gap between the electrode layers 5a and 5b defines the channel in the semiconductor layer 6 (channel length).

In the wiring pattern according to an embodiment of the present invention, since a conductive pattern(s) is formed by controlling the surface energy of the variable wettability layer 2, it is possible to provide additional functions to the variable wettability layer 2 itself (e.g., function as a protective barrier against moisture or gas).

In the example of FIG. 23, since the variable wettability layer 2 covers the surface of the substrate 7, the variable wettability layer 2 functions as a barrier layer against gas or water in a case where the substrate 7 is formed of a material (e.g., plastic) through which gas or water can permeate. Thereby, adverse effects of such gas or water on the electronic device 31 can be effectively reduced.

Figure 24:
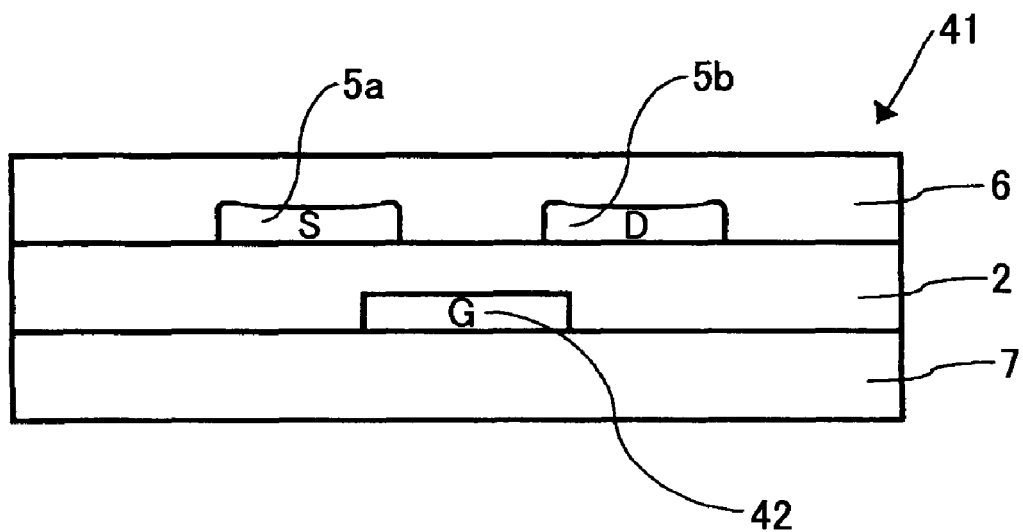
FIG. 24 is a cross-sectional view showing another exemplary configuration of an electronic device according to an embodiment of the present invention.

FIG. 24 shows an electronic device 41 according to another embodiment of the present invention.

Referring to FIG. 24, the electronic device 41 of the present embodiment is formed by a process including the step of forming an electrode layer 42 on a substrate of glass; plastic such as polycarbonate, polyacrylate, polyether sulfonate, and the like; a silicon wafer; or a metal by any of an evaporation deposition method, a CVD method, a spin coating method, a dip coating method, a casting method, and the like, wherein various conductive films can be used for the electrode layer 42. The electrode layer 42 may be patterned by an ordinary photolithography or micro contact printing method after forming to cover the entire surface of the substrate, or alternatively directly in the form of a conductive layer pattern by supplying a conductive liquid containing a conductive material by an ink jet process and the like.

After forming the electrode layer pattern 42, the variable wettability layer 2 is formed on the electrode layer pattern 42 in a similar manner to that described in FIG. 23. Since this variable wettability layer 2 is used also as a gate insulating film, it is preferable that the variable wettability layer 2 have a high insulating property. Further, it should be noted that the variable wettability layer 2 has a two-layered structure including an upper layer having large variable wettability and a lower layer of small or no wettability but with an excellent insulating property. In the variable wettability layer 2, there is formed a pattern having a low surface energy part 4 and a high surface energy part 3 (not shown) in a similar manner to that described above, and the electrode layers 5a and 5b are formed on the high surface energy part 3 in the form of a conductive layer by applying a conductive liquid containing a conductive material.

Finally, the semiconductor layer 6 is formed in a similar manner to that described above. Although FIG. 24 shows that the semiconductor layer 6 is formed in a manner covering the entire surface of the variable wettability layer 2, the semiconductor layer 6 may be formed as an island which partially covers at least the channel region.

As is apparent in FIG. 24, the electronic device 41 functions as a TFT (thin film transistor). Thereby, the electrode layer 42 forms a gate electrode (G), the variable wettability layer 2 forms a gate insulating film, and the electrode layers 5a and 5b form source and drain electrodes (S, D), wherein the gap between the electrode layers 5a and 5b defines the channel region of the TFT (channel length). Since the variable wettability layer 2 also functions as a gate insulating film, the device of FIG. 24 can be manufactured with a simplified process compared to that of FIG. 23.

In the embodiment of FIG. 24, it is also possible to provide another variable wettability layer (not shown) separate from the variable wettability layer 2 and use the other variable wettability layer for patterning the electrode layer 42.

The above-described wiring pattern according to another embodiment of the present invention may be formed on a multi-layer structure via an insulating film. That is, by forming plural layers of wiring patterns having conductive patterns with small bulge corner parts, insulation failure between conductive layers including conductive patterns can be prevented. Thereby, a highly reliable multi-layer wiring pattern having an improved insulating property can be obtained. Such multi-layer wiring pattern can be suitably used for fabricating wiring patterns of, for example, various electronic devices and display apparatuses.

In a multilayer configuration, the insulation property can be further improved by forming the above-described rectangular wiring pattern having chamfered corner parts so that the wiring pattern is not superposed on wiring patterns in other layers with respect to a cross-sectional view of the multilayer configuration. In addition, this enables the insulating layer to be formed thinner. As a result, a compact reliable multilayer wiring configuration can be fabricated.

Furthermore, the above-described wiring pattern according to an embodiment of the present invention can be formed on a substrate. With the wiring pattern, insulation failure can be prevented even when another layered wiring structure is formed on the wiring pattern via an insulating layer. Thus, a substrate having such a wiring pattern formed thereon can be suitably used in, for example, various electronic devices and display apparatuses.

EXAMPLE

Examples of the foregoing embodiment are described below with comparative examples.

Example 1

A variable wettability layer (hereinafter also referred to as "wettability control film") is formed by applying a mixed solution having dissolved therein a precursor of the materials having a structure expressed with the below Formulas 6 and 7 onto a glass substrate by using a spin-coating method and baking the mixed solution in an environment of 280° C.

[Formula 6]

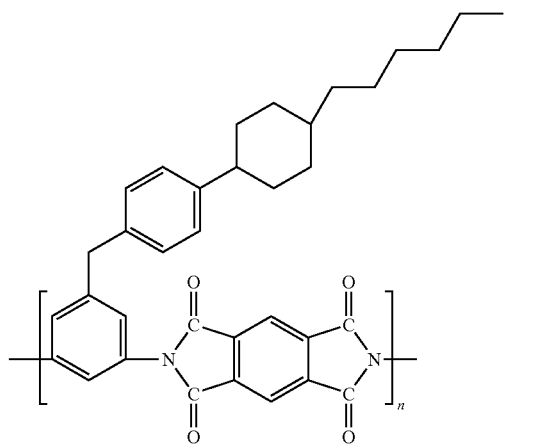

(VI)

[Formula 7]

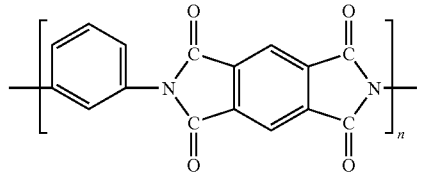

(VII)

Then, a wettability area (high surface energy part) is formed on the variable wettability layer by using a mask having a pattern (opening(s)). The pattern of the mask is chamfered in a manner shown in FIG. 7A and has a line width of 80 μm and a chamfer length of 20 μm. In measuring the contact angle of the wettability area by using a silver nanoparticle ink, the wettability area exhibited a contact angle that is no greater than 5°.

Then, a conductive liquid (in this example, silver nanoparticle ink) is applied to the wettability area by using an inkjet method. Then, the variable wettability layer on which the silver nanoparticle ink is applied is dried and baked, to thereby form a conductive pattern on the surface of the variable wettability layer. In observing the surface of the baked variable wettability layer with a microscope, the outline part of the conductive pattern exhibited little increase in its thickness (small bulge) and showed no formation of grooves (cave-in).

In observing the profile of the conductive pattern formed on the variable wettability layer by using an AFM, a center part of the conductive pattern exhibited a film thickness of 100 nm while an outline part of the conductive pattern exhibited a film thickness of 200 nm. Accordingly, a gradual descending slope from a cross-sectional view (see FIG. 7B)

can be formed as the conductive pattern extends from its corner parts to its center part in a plan view of the conductive pattern (see FIG. 7A).

Comparative Example 1

Other than forming a wettability area by irradiating UV rays via a mask having a pattern (opening(s)) that is not chamfered (line width of 80 μm), Comparative Example 1 forms a conductive pattern with the same method as Example 1 where an inkjet method is used to apply silver nanoparticle ink to a wettability area and the silver nanoparticle ink is dried and baked.

In observing the surface of the baked variable wettability layer of the Comparative Example 1 with a microscope, the corner parts of the conductive pattern exhibited a significant increase in its thickness (large bulge) and showed grooves (cave-ins) formed at the bulge part. Furthermore, in observing the profile of the conductive pattern of the Comparative Example 1 formed on the variable wettability layer by using an AFM, a center part of the conductive pattern exhibited a film thickness of 100 nm while the corner parts of the conductive pattern exhibited a film thickness of 700 nm. That is, the corner parts from a cross-sectional view (see FIG. 7B) project upward and a steep descending slope from a cross-sectional view can be formed as the conductive pattern extends from its corner parts to its center part in a plan view of the conductive pattern.

Example 2

In Example 2, an insulating film is formed on the conductive pattern described in Example 1 (hereinafter referred to as "first conductive pattern layer") by spin-coating polyimide onto the first conductive pattern layer and baking the coated configuration. Then, a second wettability control film formed of the same material as the Example 1 is formed on the insulating film. The combined thickness of the polyimide insulating film and the second wettability control film is 500 nm. Then, a wettability pattern (second wettability area) is formed on the second wettability control film by arranging a mask at a predetermined position on the second wettability control film and irradiating UV rays thereto. The mask is positioned so that the pattern of the second wettability control film intersects (overlaps) with the first pattern layer. Then, a silver nanoparticle ink is applied to the second wettability area by using an inkjet method. Then, the wettability control film on which the silver nanoparticle ink is applied is dried and baked, to thereby form a conductive pattern (second conductive pattern layer) on the second wettability control film.

In a case where a voltage of 1 MV/cm was applied between the first conductive pattern layer and the second conductive pattern layer, a satisfactory insulating property was observed without any dielectric breakdown.

Comparative Example 2

In Comparative Example 2, an insulating film is formed on the conductive pattern described in Comparative Example 1 by spin-coating polyimide onto the conductive pattern and baking the coated configuration. Then, a second wettability control film formed of the same material as the Example 1 is formed on the insulating film. The combined thickness of the polyimide insulating film and the other wettability control film is 500 nm. Then, a wettability pattern (second wettability area) is formed on the second wettability control film by arranging a mask at a predetermined position on the second wettability control film and irradiating UV rays thereto. The mask is positioned so that the pattern of the second wettability control film intersects (overlaps) with the conductive pattern described in Comparative Example 1 (first conductive pattern). Then, a silver nanoparticle ink is applied to the second wettability area by using an inkjet method. Then, the wettability control film on which the silver nanoparticle ink is applied is dried and baked, to thereby form a conductive pattern (second conductive pattern layer) on the second wettability control film of the Comparative Example 2.

In a case where a voltage of 1 MV/cm was applied between the first conductive pattern layer and the second conductive pattern layer, a dielectric breakdown was created.

Example 3

In Example 3, ten devices (in this example, thin film transistors (TFT)) having an electrode configuration shown in a plan view of FIG. 25B were fabricated under the below-described conditions.

Figure 25A:
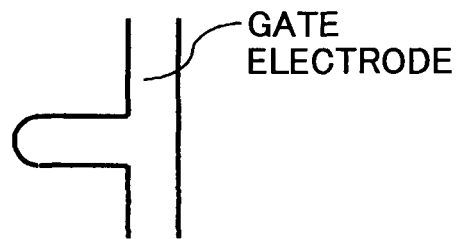
FIGS. 25A and 25B are schematic plan views showing an exemplary configuration of an electrode(s) of a thin film transistor (TFT) according to an embodiment of the present invention.
Figure 25B:
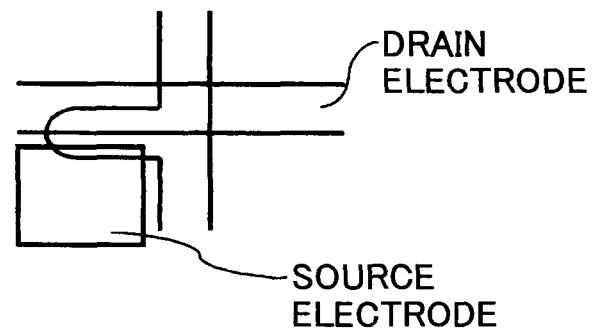

First, as shown in FIG. 25A, a conductive pattern (gate electrode pattern) is formed by using the same material and method as those described in Example 1. The gate electrode pattern has a line width of 80 μm and a rounded chamfered part with a radius (R) of 40 μm. Then, a variable wettability layer (wettability control layer) is formed on the gate electrode pattern by spin-coating polyimide onto the gate electrode pattern and baking the coated configuration. Then, as shown in FIG. 25B, a source electrode pattern and a drain electrode pattern are formed on the variable wettability layer by arranging a mask at a predetermined position on the variable wettability layer and irradiating UV rays thereto.

Finally, a semiconductor layer is formed on the variable wettability layer by spin-coating a solution having a below-described polymer 1 dissolved in toluene and drying the layered configuration.

[Formula 8]

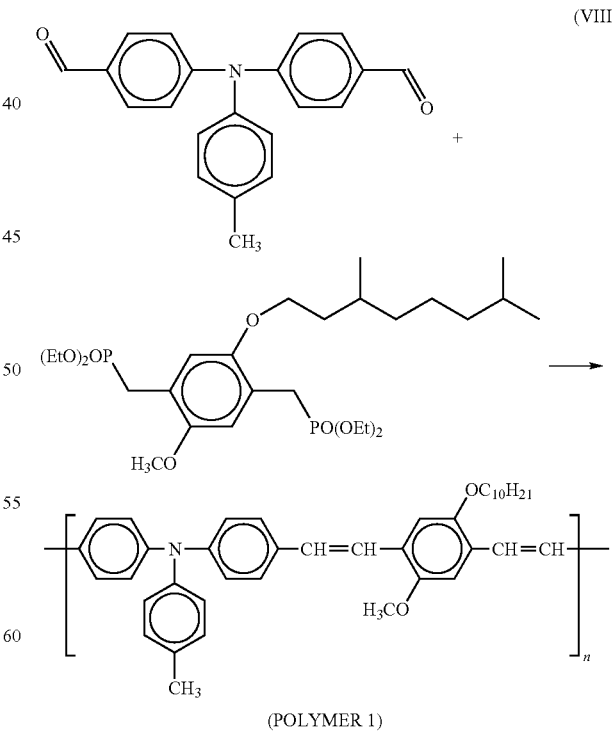

(POLYMER 1)

In evaluating the ten TFTs fabricated by the above-described method, all of the ten TFTs exhibited satisfactory performance between the gate electrode and the source electrode and satisfactory performance between the gate electrode and the drain electrode without any short circuiting.

Comparative Example 3

Other than forming a gate electrode having a pattern that is not chamfered, Comparative Example 3 fabricated ten devices (TFTs) with the same method as Example 3.

In evaluating the fabricated ten TFTs with the same method as that of Example 3, all of the ten TFTs exhibited defects in which short circuiting occurred between the gate electrode and the source electrode and between the gate electrode and the drain electrode for all of the ten TFTs.

Accordingly, as shown in the results of the above-described Examples 1-3, a wiring pattern having a conductive pattern layer with small bulges at its corner parts can be obtained. Thus, in a case where the configuration of the wiring pattern is used in a TFT, satisfactory performance can be attained without insulation failure.

Hence, a wiring pattern having the above-described configuration according to an embodiment of the present invention can be used for fabricating an electronic device, an organic semiconductor device, a layered wiring pattern, and a layered wiring substrate.

Further, the present invention is not limited to these embodiments, but variations and modifications may be made without departing from the scope of the present invention.

The present application is based on Japanese Priority Application No.2006-243988 filed on Sep. 8, 2006, with the Japanese Patent Office, the entire contents of which are hereby incorporated by reference.

What is claimed is:

1. A wiring pattern comprising:
a variable wettability layer including a material whose critical surface tension changes in response to energy provided thereto, the variable wettability layer including a high surface energy part exhibiting a high critical surface tension and a low surface energy part exhibiting a low critical surface tension; and
a conductive pattern layer formed on the variable wettability layer at the high surface energy part;
wherein the conductive pattern layer has an elongated shape with a chamfered corner part in a plan view and the high surface energy part includes a chamfered corner part in a plan view.

2. The wiring pattern as claimed in claim 1, further comprising:
a semiconductor layer contacting the low surface energy part.

3. The wiring pattern as claimed in claim 2, wherein the semiconductor layer is an organic semiconductor layer.

4. The wiring pattern as claimed in claim 1, wherein another conductive pattern layer is formed on an entire surface of the wiring pattern via an insulating layer.

5. The wiring pattern as claimed in claim 4, wherein the other conductive pattern layer is disposed on a high surface energy part of another variable wettability layer.

6. The wiring pattern as claimed in claim 1, wherein the chamfered corner part has a rounded shape in a plan view.

7. The wiring pattern as claimed in claim 1, wherein the conductive pattern layer is formed by using an inkjet method which applies a conductive liquid on the high surface energy part of the variable wettability layer.

8. An electronic device comprising:
the wiring pattern as claimed in claim 1.

9. A layered wiring pattern comprising:
a plurality of layers of the wiring pattern claimed in claim 1, wherein an insulating film is provided between each of the layers.

10. The layered wiring pattern as claimed in claim 9, wherein the elongated conductive pattern layer of the wiring pattern does not overlap with those of the wiring pattern of other layers.

11. A layered wiring pattern substrate comprising:
a substrate on which the wiring pattern claimed in claim 1 is formed.

12. An organic semiconductor device comprising:
a wiring pattern having
a variable wettability layer including a material whose critical surface tension changes in response to energy provided thereto, the variable wettability layer including a high surface energy part exhibiting a high critical surface tension and a low surface energy part exhibiting a low critical surface tension,
a conductive pattern layer formed on the variable wettability layer at the high surface energy part, and
an organic semiconductor layer contacting the low surface energy part; and
another conductive pattern layer formed on either an entire surface of the wiring pattern via another variable wettability layer or an insulating layer formed on the organic semiconductor layer;
wherein the conductive pattern layer has an elongated shape with a chamfered corner part in a plan view and the high surface energy part includes a chamfered corner part in a plan view.

13. The organic semiconductor device as claimed in claim 12, wherein the chamfered corner part has a rounded shape in a plan view.

14. The organic semiconductor device as claimed in claim 12, wherein the organic semiconductor device is a thin film transistor (TFT).

15. A method for producing a wiring pattern comprising:
forming a variable wettability layer, the variable wettability layer including a material whose critical surface tension changes in response to energy provided thereto, the variable wettability layer including a high surface energy part exhibiting a high critical surface tension and a low surface energy part exhibiting a low critical surface tension;
forming a mask having a pattern for a conductive pattern layer on the variable wettability layer, wherein the mask is chamfered at a corner part in a plan view;
forming the high surface energy part having a chamfered corner part in a plan view by using the mask; and
forming the conductive pattern layer on the variable wettability layer at the high surface energy part by using an inkjet method which applies a conductive liquid on the high surface energy part of the variable wettability layer,
wherein the conductive pattern layer has an elongated shape with a chamfered corner part in a plan view.

16. The method according to claim 15, further comprising:
forming another conductive pattern layer on an insulating layer formed on the wiring pattern.

17. The method according to claim 16, further comprising:
forming the other conductive pattern layer by applying a conductive liquid onto a high surface energy part of another variable wettability layer.

18. The method according to claim 15, further comprising:
providing a substrate on which the variable wettability layer is formed.

* * * * *